United States Patent [19]
Ishii et al.

[11] Patent Number: 5,960,266
[45] Date of Patent: Sep. 28, 1999

[54] PROCESS FOR MANUFACTURING A QUANTUM MEMORY ELEMENT DEVICE

[75] Inventors: Tomoyuki Ishii, Kodaira; Kazuo Yano; Koichi Seki, both of Hino; Toshiyuki Mine, Fussa; Takashi Kobayashi, Kokubunji, all of Japan

[73] Assignee: Hitachi, Ltd., Tokyo, Japan

[21] Appl. No.: 08/878,206

[22] Filed: Jun. 18, 1997

Related U.S. Application Data

[62] Division of application No. 08/600,678, Feb. 13, 1996, Pat. No. 5,684,734.

[30] Foreign Application Priority Data

Feb. 17, 1995 [JP] Japan .................................. 7-052012

[51] Int. Cl.$^6$ ..................... H01L 21/00; H01L 21/84; H01L 21/31; H01L 21/469
[52] U.S. Cl. ..................... 438/161; 438/962; 438/149; 438/151; 438/300
[58] Field of Search ..................... 438/161, 151, 438/149, 300, 962, 257, 264

[56] References Cited

U.S. PATENT DOCUMENTS 5,214,296  5/1993  Nakata et al. ..................... 257/71
5,386,381  1/1995  Takizawa et al. .

OTHER PUBLICATIONS

Nikkei Electronics, No. 444, 1988, pp. 151–157.
S. Tiwari et al, "A Low Power 77 K Nano–Memory with Single Electron Nano–Crystal Storage", 53rd Annual Device Research Conference Digest, 1995, pp. 50–51.
T. Hashimoto et al, "An 8 nm–thick Polysilicon MOS Transistor and Its Thin Film Effects", 21st Conference On Solid–State Devices And Materials, 1989, pp. 97–100.
K. Yano et al, "Room–Temperature Single–Electron Memory", IEEE Transactions On Electron Devices, vol. 41, No. 9, Sep. 1994, pp. 1628–1638.

*Primary Examiner*—Richard Booth
*Assistant Examiner*—Neal Berezny
*Attorney, Agent, or Firm*—Fay, Sharpe, Beall, Fagan, Minnich & McKee

[57] ABSTRACT

A quantum semiconductor memory element is disclosed which can share the terminals easily among a plurality of memory elements and can pass a high current and which is resistant to interference from noises. In order to accomplish this a control electrode is formed to cover the entirety of thin film regions connecting low-resistance regions. As a result, the element can have a small size and can store information with high density. Thus, a highly integrated, low power consumption non-volatile quantum memory device can be realized with reduced size.

3 Claims, 27 Drawing Sheets

PROCESS FOR MANUFACTURING A QUANTUM MEMORY ELEMENT DEVICE

This is a divisional application of U.S. Ser. No. 08/600,678, filed Feb. 13, 1996 now U.S. Pat. No. 5,684,734.

FIELD OF THE INVENTION

The present invention relates to a semiconductor element suited for applications requiring high integration.

BACKGROUND OF THE INVENTION

An example of a prior art reference showing a single electron memory using polycrystalline silicon disclosed on pp. 541 to 544 by K. Yano et al., IEEE International Electron Devices Meeting, 1993. According to the technique disclosed, the channels for current paths and the memory regions for capturing electrons are simultaneously formed from a polycrystalline silicon thin film. Information is stored by making use of the fact that the threshold voltage changes when electrons are captured in the memory regions. According to this technique, 1 bit is stored corresponding to the storage of one electron. By utilizing the crystal grain of the polycrystalline silicon, a small structure can be realized to operate at room temperature.

In the prior art, a non-volatile memory device such as a flash EEPROM has been realized by using MOSFETs having floating gates and control gates. Information is stored and read out by making use of the fact that the threshold voltage of the MOSFETs is changed by storing carriers in the floating gates. The floating gates are usually made of polycrystalline silicon. By using the MOSFETs with floating gates, the information of 1 bit can be stored for a long time by a single transistor. An example of a prior art structure embodying the memory cell structure of the flash EEPROM is disclosed on pp. 151 to 157 of Nikkei Electronics No. 444, 1988.

Another example of prior art relating to deposition of thin polycrystalline silicon on various insulator films is disclosed by T. Hashimoto et al., *Conference on Solid State Devices and Materials*, pp 97–100 (1989). Hashimoto et al. disclose that obtaining continuous thin silicon film using LPCVD depositions on CVD $SiO_2$ and on $Si_3N_4$ are better than on thermal $SiO_2$.

SUMMARY OF THE INVENTION

The present inventors have discovered problems with the prior art structure which has led to the present invention. Some of the problems are first discussed herein.

It is noted that a single electron memory for storing information with a small number of electrons can possibly even operate at a nanometer level because one element can store the information of 1 bit or more and can control the stored charge at one unit. Because of the small number of stored electrons, moreover, drastic improvement can be expected in the rewriting time period and in the rewriting times.

However, the aforementioned single electron memory of the prior art is a single element for storing 1 bit and no means is known for storing the information of 2 bits or more. If this single element is simply used to store the information of N bits (e.g., 65,536 in the case of a 64 Kbit memory), an N number of control electrodes and an N number of current drive paths must be controlled from the outside of the chip. Thus, a 2N number (i.e., 131,072) of terminals are required and this is impractical.

In order to avoid this, the present inventors have found it important to share a terminal among a plurality of memory elements and have made unique investigations to find out the storage of 2 bits with the structure shown in FIG. 3. As shown in FIG. 3, a thin film region (150) lying over an insulator connects first and second low-resistance regions (151) and (152); a thin film region (180) over the insulator connects third and fourth low-resistance regions (181) and (182); and a control electrode (153) covers the first thin film region (150) and the second thin film region (180) partially at a right angle with respect to the first thin film region (150) and the second thin film region (180). This structure reduces the number of the terminals to be driven from the outside, by sharing the control electrode.

However, in this structure, thin film region 1 (150) and thin film region 2 (180) have portions which remain uncovered by the control electrode (153). These portions are too resistive to path a high current, thus leaving a problem that needs to be solved. Moreover, these portions of the thin film region 1 (150) and the thin film region 2 (180), which are not covered by the control electrode (153), may have their potential fluctuated by the capacitive coupling with another electrode or by electromagnetic waves to thereby prevent the stored information from being stably latched.

On the other hand, not only the area occupied by the control electrode, as extended transversely of the drawing, but also the area to be occupied by the thin film polycrystalline silicon or the contacts raise the problem that a large area is necessary for storing 1 bit of information. Moreover, a tolerance is required in order to locate the control electrode (153) correctly over the thin film region 1 (150) or the thin film region 2 (180). This raises another problem due to the restriction that the distance between the low-resistance region 1 (151) and the low-resistance region 2 (152) and the distance between the low-resistance region 3 (181) and the low-resistance region 4 (182) cannot be reduced more than some predetermined values.

Thus, the present inventors have arrived at the present invention based upon these and other previous investigations. Accordingly, it is an object of the present invention to provide a semiconductor memory element which can share terminals easily among a plurality of memory elements and can pass a high current and which is strong against noise.

The present invention provides a structure in which the control electrode entirely covers the thin film regions. With such a structure, the present invention has a low resistance and a strength against external disturbances and also can be manufactured with a small area.

According to a representative mode of practice of the present invention, more specifically, there is provided a semiconductor memory element as shown in FIG. 1. This semiconductor memory element comprises: a thin film region (1) formed over an insulator and made of a semiconductor; first and second low-resistance regions (2) and (3), wherein said thin film region has its one end portion connected with said first low-resistance region (2), and wherein said thin film region has its other end portion connected with said second low-resistance region (3); and a first control electrode (4) for controlling said thin film region, wherein said control electrode (4) covers the entirety of said thin film region.

According to another mode of practice which can reduce the number of terminals of the current drive paths and can be suited for integration, as compared with the case in which single memory elements are simply arranged, there is provided a semiconductor memory element for storing 2 bits or more as shown in FIG. 4. This semiconductor memory element comprises: first and second thin film regions (21) and (22) formed over an insulator and made of a semiconductor; first and second low-resistance regions (23) and (24) are thicker than said thin film regions and formed into a substantially rectangular shape having its longer side two times or more longer than its shorter side, wherein said first thin film region (21) has its one end portion connected with said first low-resistance region (23), wherein said first thin film region (21) has its other end portion connected with said second low-resistance region (24), wherein said second thin film region (22) has its one end portion connected with said first low-resistance region (23), and wherein said second thin film region (22) has its other end portion connected with said second low-resistance region (24); a first control electrode (26) for controlling said first thin film region (21); and a second control electrode (27) for controlling said second thin film region (22).

According to yet another mode of practice which can reduce the number of terminals of the control electrode and can be suited for integration, as compared with the case in which single memory elements are simply arranged, there is provided a semiconductor memory element for storing 2 bits or more as shown in FIG. 6. This semiconductor memory element comprises: first and second thin film regions (143) and (144) formed over an insulator and made of a semiconductor; first, second, third and fourth low-resistance regions (145), (146), (147) and (148) made thicker than said thin film regions, wherein said first thin film region has its one end portion connected with said first low-resistance region (145), wherein said first thin film region has its other end portion connected with said second low-resistance region (146), wherein said second thin film region has its one end portion connected with said third low-resistance region (147), and wherein said second thin film region has its other end portion connected with said fourth low-resistance region (148); and a common control electrode (149) for controlling said first and second thin film regions (143) and (144).

According to a mode of practice which can be controlled with fewer terminals and suited for integration by combining the advantages described above and by arranging the elements in a matrix shape, there is provided a semiconductor memory element for storing 4 bits or more as shown in FIG. 14. This semiconductor memory element comprises: first, second, third and fourth thin film regions (79), (80), (81) and (82) formed over an insulator and made of a semiconductor; first, second, third and fourth low-resistance regions (83), (84), (85) and (86) made thicker than said thin film regions and formed into a substantial rectangle having its longer side longer two times or more longer than its shorter side, wherein said first thin film region (79) has its one end portion connected with said first low-resistance region (83), wherein said first thin film region (79) has its other end portion connected with said second low-resistance region (84), wherein said second thin film region (80) has its one end portion connected with said first low-resistance region (83), wherein said second thin film region (80) has its other end portion connected with said second low-resistance region (84), wherein said third thin film region (81) has its one end portion connected with said third low-resistance region (85), wherein said third thin film region (81) has its other end portion connected with said fourth low-resistance region (86), wherein said fourth thin film region (82) has its one end portion connected with said third low-resistance region (85), and wherein said fourth thin film region (82) has its other end portion connected with said fourth low-resistance region (86); a first control electrode (87) formed into a substantial rectangle having its longer side two times or more longer than its shorter side for controlling said first and third thin film regions (79) and (81); and a second control electrode (88) formed into a substantial rectangle having its longer side two times or more longer than its shorter side for controlling said second and fourth thin film regions (80) and (82).

These and other objects, features and advantages of the present invention will become more apparent in view of the following detailed descriptions of the preferred embodiments.

BRIEF DESCRIPTION OF THE DRAWINGS

FIG. 29(*b*) is a schematic diagram of the thin film region of Embodiment 1 of the present invention.

DETAILED DESCRIPTION OF THE PREFERRED EMBODIMENTS

Figure 3A:
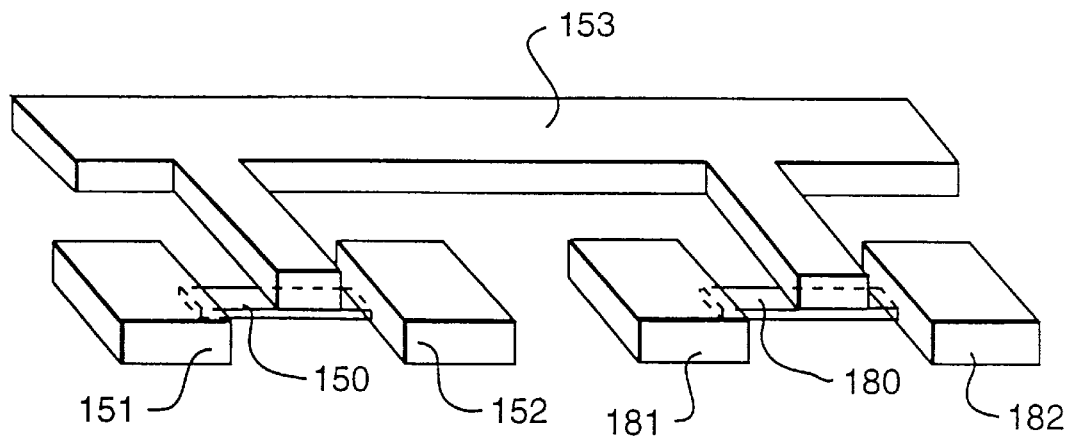
FIGS. 3(*a*) and 3(*b*) are structural diagrams of the element structure which has been examined at first for the integration: where 3(*a*) is a perspective view; and 3(*b*) is a top plan view.
Figure 3B:
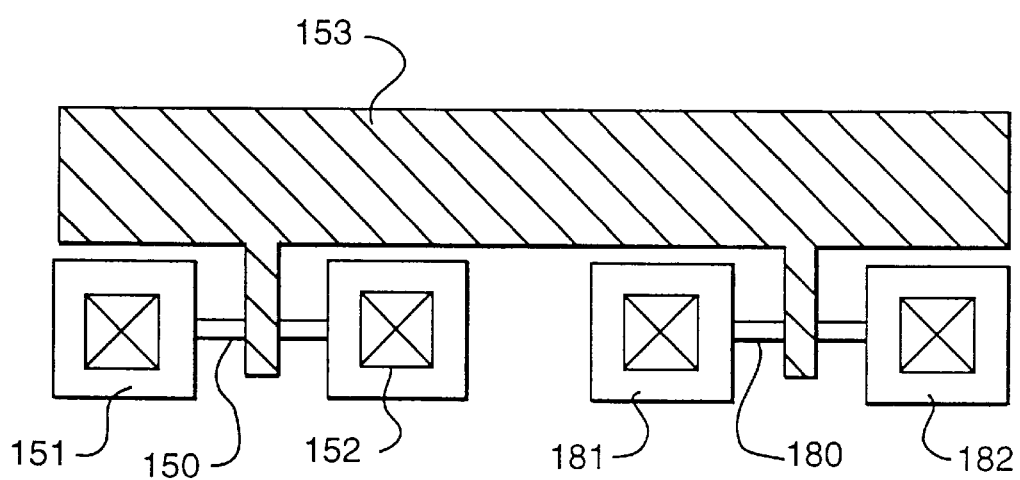

In the memory element (of FIG. 1) according to the representative mode of practice of the present invention, since the control electrode (4) covers the entirety of the thin film region (1), the control electrode (4) can control the entirety of the thin film region (1) so that the thin film region has its highly resistive portion eliminated to pass a high current and thereby to shorten the reading time period. Since the thin film region (1) is wholly covered with the control electrode (4), the capacitive coupling between the outside and the thin film region (1) is reduced so that the thin film region (1) is more resistant to outside disturbances. Moreover, the distance between the low-resistance region 1 (2) and the low-resistance region 2 (3) can to an extent be set at a low value as long as there is a feasible matching with the control electrode (4). Also, with the structure of the present invention, a rectangular shape can be taken unlike the control electrode (153) of FIG. 3, so that the control electrode (4) can have a small area.

Even with the structure in which the control electrode (4) covers the whole surface, it is not clear at first whether or not the memory effect, as reported by Yano et al., appears. Therefore, the present inventors have actually made a prototype element and can confirm its actions. Specifically, it has been confirmed (as shown in FIG. 2) that the memory element (of FIG. 1) according to the present mode of embodiment exhibits a hysteresis in the conductance of the thin film region (1) even at the room temperature when the potential difference between the control electrode (4) and the low-resistance region 1 (2) is repeatedly increased or decreased within a predetermined range with the voltage between the low-resistance region 1 (2) and the low-resistance region 2 (3) being held constant.

Figure 1A:
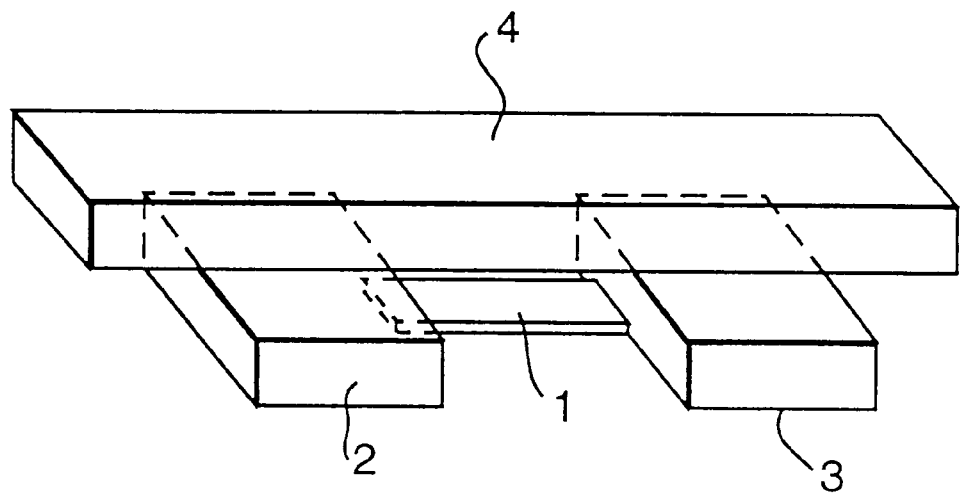
FIGS. 1(*a*) and 1(*b*) are structural diagrams of a semiconductor element of the Embodiment 1 of the present invention: where 1(*a*) is a perspective view; and 1(*b*) a top plan view.
Figure 1B:
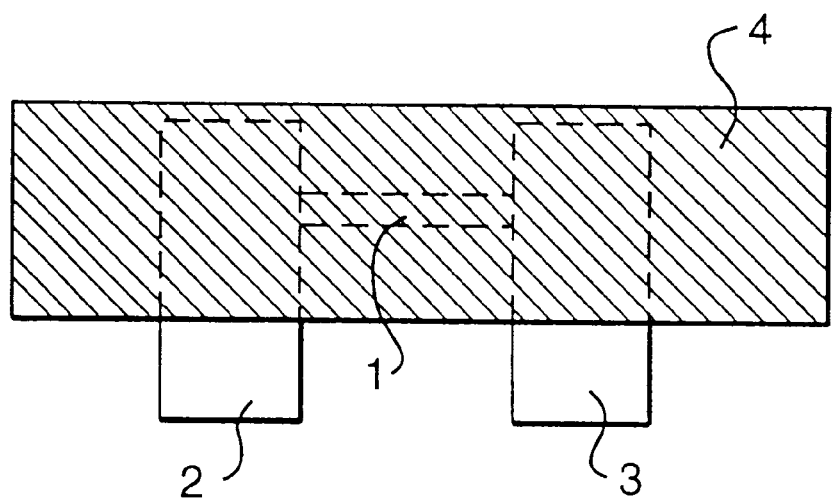
Figure 2:
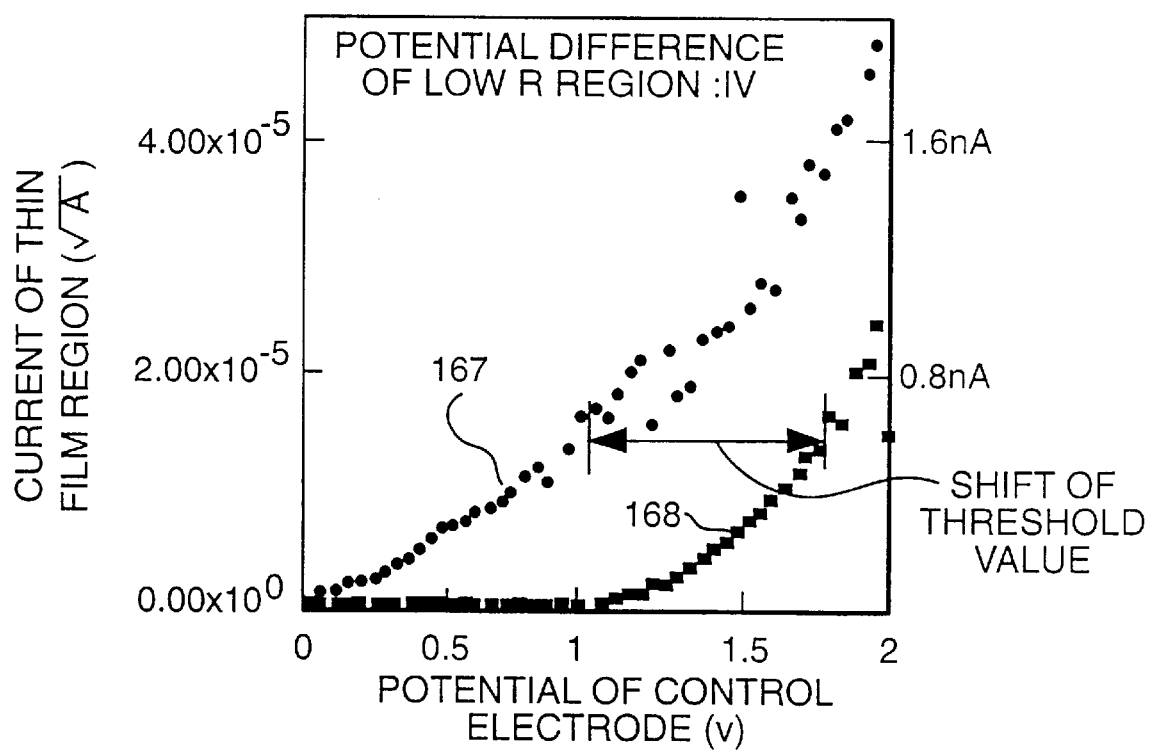
FIG. 2 is a diagram plotting the metered values of the dependency of the current to flow between the two low-resistance regions upon the voltage between the control electrode and the low-resistance region 1 of Embodiment 1.

FIG. 2 plots the experimental results of the memory element (of FIG. 1) according to the present mode of practice. The left-hand current-voltage characteristics (167) are obtained after the following conditions are satisfied: the low-resistance region 1 (2) is set to 0 V; the low-resistance region 2 (3) is set to 1 V; and the potential of the control electrode (4) is set to −6 V. The right-hand current-voltage characteristics (168) are obtained after the following conditions are satisfied: the low-resistance region 1 (2) is set to 0 V; the low-resistance region 2 (3) is set to 1 V; and the potential of the control electrode (4) is set to 12 V. A shift of about 1 V is found in view of the threshold voltage for writing at 12 V and erasing at −6 V. It has been confirmed that a detectable current of about 1 nA flows.

It should be noted that the operation is valid even if the potential difference to be fed to the low-resistance region 1 (2) and the low-resistance region 2 (3) is set to a level as high as 1 V. As to the quantum effect devices, it is common sense that the effect disappears if a large potential difference is applied. This result, i.e., that the memory can operate even at the level of 1 V has never been known before the experiments performed by the present inventors.

Figure 4A:
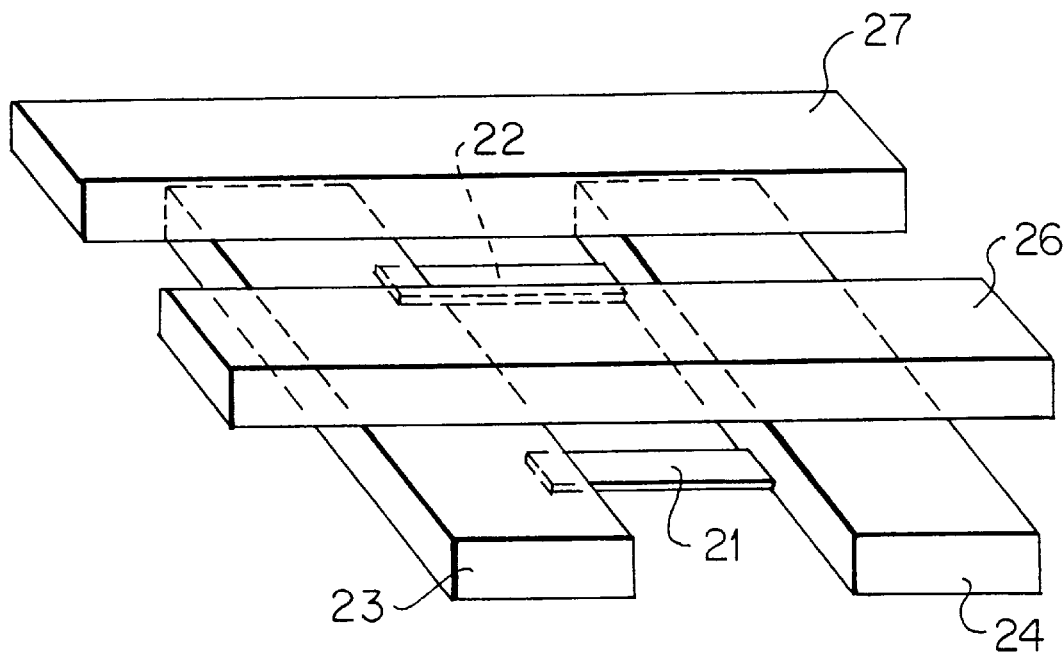
FIGS. 4(*a*) and 4(*b*) illustrate a structural diagram of a semiconductor element of Embodiment 2 of the present invention: where 4(*a*) is a perspective view; and 4(*b*) is a top plan view.
Figure 4B:
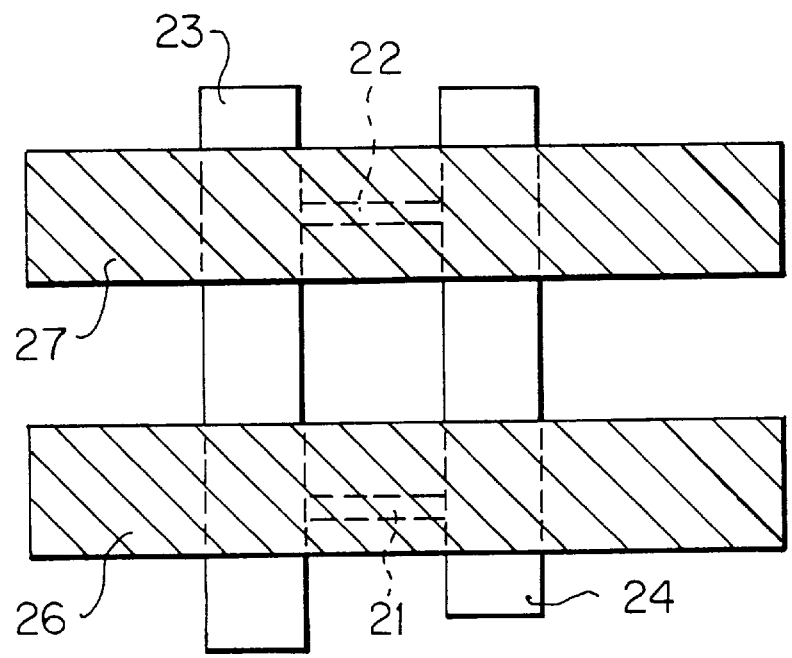
Figure 6A:
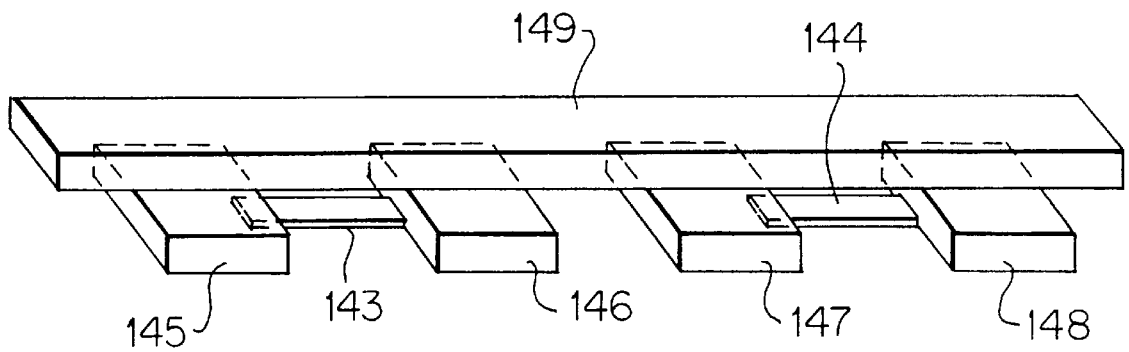
FIGS. 6(*a*) and 6(*b*) are structural diagrams of a semiconductor element of Embodiment 3 of the present invention: where 6(*a*) is a perspective view; and 6(*b*) is a top plan view.
Figure 6B:
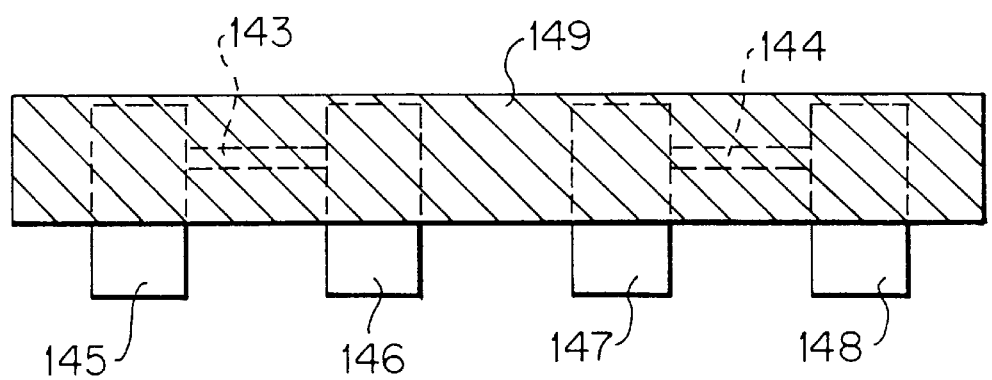

Incidentally, by making use of the fact that the change in the conductance of the thin film region is different according to the erasing conditions, 1 bit or more can be stored in one thin film region so that the information recording density can be improved. By using the present structure, it is possible to reduce the area of the structure in which the common control electrode (149) is shared between the two memory elements, as shown in FIG. 6. Also, by using the present structure the area can be reduced if the common low-resistance region (23 or 24) is shared between the two memory elements, as shown in FIG. 4. By combining these structures, the control electrodes (87) and (88) and the low-resistance regions (83) to (86) can be shared to reduce the area of the manufacture even in case the four memory elements are arranged in a matrix shape, as shown in FIG. 14.

Figure 14A:
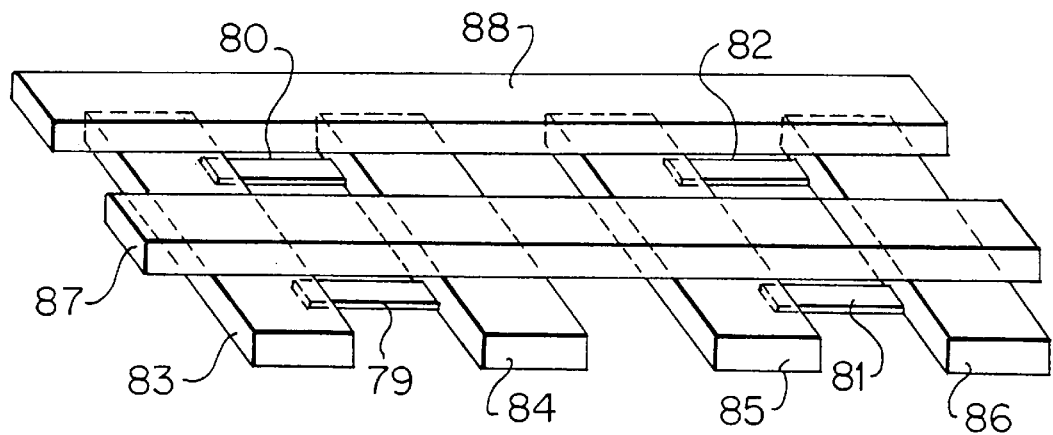
FIGS. 14(*a*) and 14(*b*) are structural diagrams of a semiconductor element of Embodiment 11 of the present invention: where 14(*a*) is a perspective view; and 14(*b*) is a top plan view.
Figure 14B:
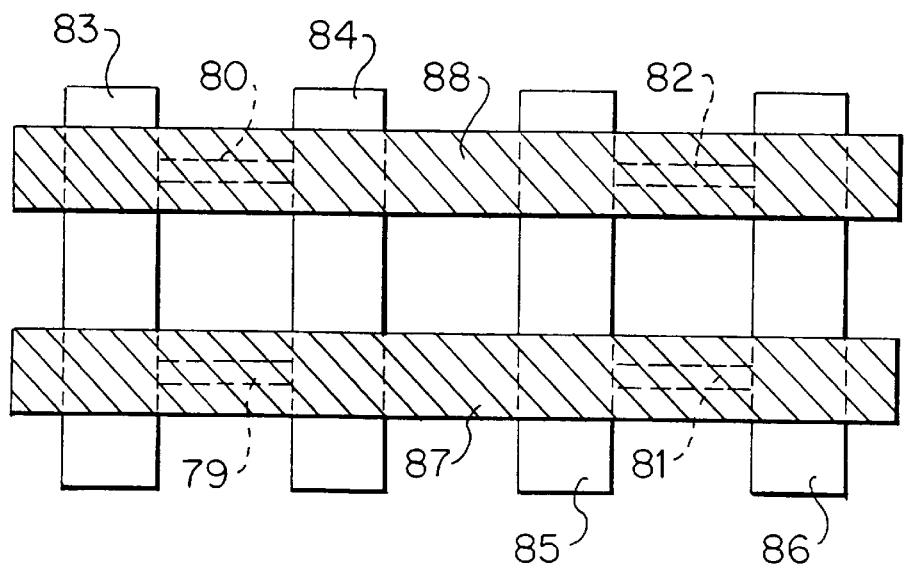

Furthermore, even if the control electrodes and the low-resistance regions are shared, as shown in FIGS. 4, 6 and 14, information can be independently written into and read out from the individual elements. The information writing and reading methods will now be individually described with reference to FIGS. 4, 6 and 14.

According to the embodiment of FIG. 4, a memory element is featured by reducing the number of the current drive paths (or the low-resistance regions) because the thin film region 1 (21) and the thin film region 2 (22) share low-resistance region 1 (23) and low-resistance region 2 (24). Even with the low-resistance regions being shared, the information can be written in only one of thin film region 1 (21) and thin film region 2 (22) but not both, by setting the low-resistance region 1 (23), the low-resistance region 2 (24), the control electrode 1 (26) and the control electrode 2 (27) to proper voltages. Likewise, information can be erased from only one of thin film region 1 (9) and thin film region 2 (10) but not from the other. Here, the injection of electrons corresponds to the writing operation, and the release of electrons corresponds to the erasing operation. These corresponding relations may be reversed in some publications.

The information writing and erasing methods according to the present embodiment will now be described. The thin film region 1 (21) is written by fixing the individual potentials of the low-resistance region 1 (23) and the low-resistance region 2 (24) (to 0 V and 5 V, for example) and by setting the control electrode 1 (26) to a predetermined high potential Vw (e.g., 10 V,). It is to be noted that "Vw" as used herein refers to the voltage to be applied to the control electrode at a writing time, "Ve" refers to the voltage to be applied to the control electrode at an erasing time, and "Vr" corresponds to the voltage to be applied to the control electrode at a reading time. The thin film region 2 (22) is not written to unless the control electrode 2 (27) is set to a high potential (e.g., 5 V). When erasing, the stored information of the thin film region 1 l(21) is erased by setting the low-resistance regions (23) and (24) to predetermined potentials (e.g., 0 V and 5 V, respectively), and by setting the control electrode 1 (26) to a predetermined low potential Ve (e.g., −5 V). At this time, the information of the thin film region 2 (22) is not erased unless the control electrode 2 (27) is set to a low potential (e.g., 5 V).

According to the embodiment shown in FIG. 6, the memory element is featured by reducing the number of control electrodes because the thin film region 1 (143) and the thin film region 2 (144) share the control electrode (149). In the present structure, too, the information can be written in only one of the thin film region 1 (143) and the thin film region 2 (144) but not in the other by setting the low-resistance region 1 (145), the low-resistance region 2 (146), the low-resistance region 3 (147), the low-resistance region 4 (148) and the control electrode (149) to proper voltages. Likewise, the information can be erased from only one of the thin film region 1 (143) and the thin film region 2 (144) but not from the other. The thin film region 1 (143) can be written by setting the low-resistance region 1 (145) to a low potential (e.g., 0 V), by setting the low-resistance region 2 (146), the low-resistance region 3 (147) and the low-resistance region 4 (148) to a higher potential (e.g., all 5 V), and by setting the control electrode (149) to a predetermined high potential Vw (e.g., 10 V). However, the low-resistance region 2 (146) may be set at a lower potential.

The thin film region 2 (144) is not written to if the high potential Vw is applied within a constant time period. At this time, the thin film region 1 (143) and the thin film region 2 (144) can be simultaneously written by setting the low-resistance region 3 (147) to a potential (0 V) as low as that of the low-resistance region 1 (145). The stored information of the thin film region 1 (143) may be erased by setting the low-resistance region 2 (144), the low-resistance region 3 (147) and the low-resistance region 4 (148) to a low potential (e.g., all 0 V), by setting the low-resistance region 1 (145) to a higher potential (e.g., 5 V) and by setting the low-resistance region 1 (145) to a predetermined low potential Ve (e.g., −5 V). Here, too, the low-resistance region 2 (146) may take a higher potential. The information of the thin film region 2 (144) is not erased if the low potential Ve is applied within a constant time period. As in the writing operation, the thin film region 1 (143) and the thin film region 2 (144) can be erased by setting the low-resistance region 3 (147) to the same potential to that of the low-resistance region 1 (145).

In the embodiment of FIG. 14, another mode of practice of the present invention is featured which can be controlled with fewer current drive paths (or low-resistance regions) and fewer control electrodes, because the foregoing embodiments are combined to arrange the thin film regions in a matrix shape. Large-scale integration can be achieved with a small number of terminals by repeatedly using the structures of the present invention. For the storage of N bits (e.g., 64 Kbits), the aforementioned mere arrangement of singles requires 2N number (i.e., 128,000) of terminals, but an root N number (i.e., 256) of terminals is sufficient for the repeated use of the present structures.

The writing, erasing and reading methods will now be described. The thin film region 1 (79) is written by setting the low-resistance region 1 (83) to a low potential (e.g., 0 V), by setting the low-resistance region 2 (84), the low-resistance region 3 (85) and the low-resistance region 4 (86) to a higher potential (e.g., all 5 V), and by setting the control electrode 1 (87) to a predetermined high potential V2 (e.g., 10 V). However, the low-resistance region 2 (84) may be set to a lower potential. The control electrode 2 (88) is not set to a high potential (but to 5 V, for example). At this time, the thin film region 2 (80), the thin film region 3 (81) and the thin film region 4 (82) are not written. At this time, the thin film region 1 (79) and the thin film region 3 (81) can be simultaneously written by setting the low-resistance region 3 (85) to a potential as low as that of the low-resistance region 1 (83).

When erasing, the stored information of the thin film region 1 (79) is erased by setting the low-resistance region 2 (84), the low-resistance region 3 (85) and the low-resistance region 4 (86) to a predetermined low potential (e.g., all 0 V), by setting the low-resistance region 1 (83) to a higher potential (e.g., 5 V), and by setting the control electrode 1 (87) to a predetermined low potential Ve (e.g., −5 V). However, the low-resistance region 2 (84) may be set to a higher potential. The control electrode 2 (88) is not set to a low potential (but to 5 V, for example). Here, the applications of the high potential Vw and the low potential Ve are within a constant time period. At this time, the information is not erased from the thin film region 2 (80), the thin film region 3 (81) and the thin film region 4 (82). As in the writing operation, the thin film region 1 (79) and the thin film region 3 (81) can be erased in a block by setting the low-resistance region 3 (85) to the same potential as that of the low-resistance region 1 (83). The block write and erase of the information under the control of the common control electrode are especially effective when a large amount of storage is accomplished by using the present structures repeatedly, such that the writing and erasing time periods can be drastically shortened.

These voltage settings are essentially identical to those of the following embodiments. The structure, in which the control electrodes (87) and (88) are formed over the thin film regions (79) to (82), as in the present structure, can write and erase the information of the thin film regions 1 to 4 (79) to (82) in a block. This can apply to other embodiments adopting the structure, in which the control electrodes (87) and (88) are formed over the thin film regions (79) to (82). The reading of the information of the thin film region 1 is carried out by reading the conductance of the thin film region 1 (79) such that the current value to flow between the low-resistance region 1 (83) an the low-resistance region 2 (84) is metered by applying a potential difference between the low-resistance region 1 (83) and the low-resistance region 2 (84) to set the control electrode 2 (88) to a predetermined low potential and to set the control electrode 1 (87) to a higher read potential Vr than the potential of the control electrode 2 (88). Only the information of the thin film region 1 (79) is read out by setting the control electrode 2 (88) to such a low potential that the individual thin film regions have a low conductance no matter what information might be stored in the individual thin film regions.

In case the thin film regions are arranged in the matrix shape for storage of a large scale, the basic structure is the present structure in which the four bits are arranged in the matrix shape. Even for this large scale, the method of controlling the writing, erasing and reading operations can be accomplished like in the case of 4 bits. This applies to other embodiments having four thin film regions.

Now, the memory elements according to specific embodiments of the present invention will be described in more detail.

FIG. 1 is a construction diagram of a memory element according to the present embodiment. A thin film region (1) is made of non-doped polycrystalline silicon, and a low-resistance region 1 (2) and a low-resistance region 2 (3) are made thicker of highly doped n-type polycrystalline silicon. In the example which is actually practiced, the thin film region (1) has an average thickness of 3 nm, a width of 0.1 microns and a length of 0.2 microns, and the low-resistance region 1 (2) and the low-resistance region 2 (3) have a thickness of 40 nm. The thin film region (1), the low-resistance region 1 (2) and the low-resistance region 2 (3) are underlaid by $Si_3N_4$ (7), which in turn is underlaid by $SiO_2$ (6). A control electrode (4), as made of highly doped n-type polycrystalline silicon, is formed over a $SiO_2$ which is deposited over the thin film region (1), the low-resistance region 1 (2) and the low-resistance region 2 (3).

Figure 5A:
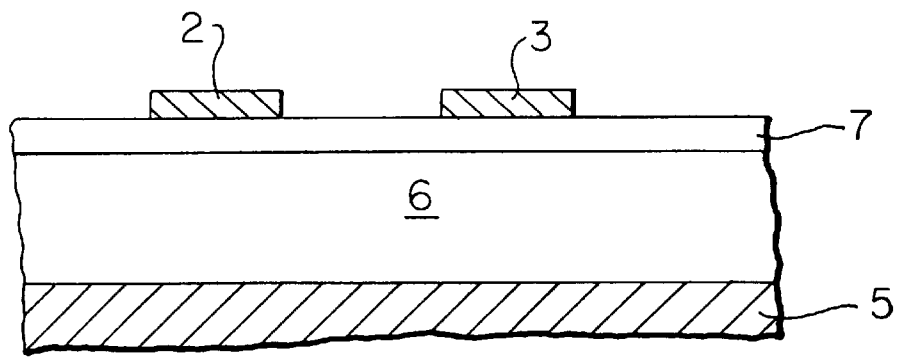
FIG. 5 illustrates sections showing the manufacturing process of the present invention.
Figure 5B:
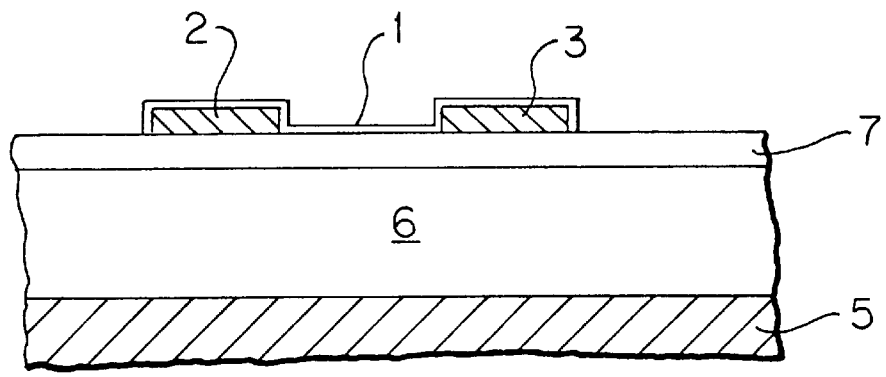
Figure 5C:
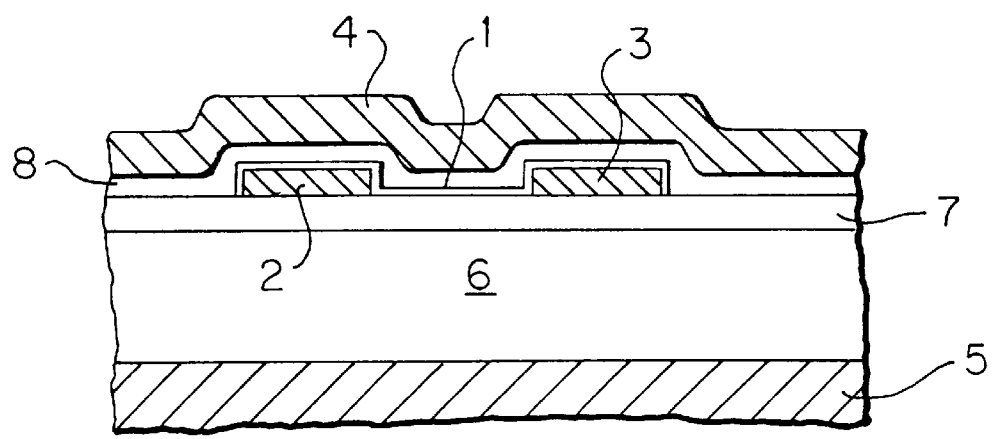

In the embodiment of FIG. 5, the thin film portion (1) is formed by depositing a (amorphous)-Si on the base of $Si_3N_4$ (7) and then by crystallizing it by a heat treatment of 750 degrees C. The time period for Si to stick to the wafer surface is shorter in case the base is $Si_3N_4$ than in case the base is $SiO_2$, so that the deposition of the a-Si thin film can be better controlled. Incidentally, a method of nitriding the surface can also be used because it achieves an effect similar to that obtained by forming the $Si_3N_4$ film.

In order to read out the conductance change due to a small number of stored charges, it is effective to set a small capacity between the thin film region (1) and the control electrode (4). The capacity between the thin film region (1) and the control electrode (4) can be set to a low value (see FIG. 5) by forming the thin film region (1) over the insulating film (6). Since, moreover, the low-resistance region 1 (2) and the low-resistance region 2 (3) are also formed over the insulator (6) so that the element is fabricated as a whole over the insulator (6), it is possible not only to make the memory element into multiple stages of stacked structure thereby to increase the memory density and to fabricate a peripheral circuit by making use of the substrate surface thereby to reduce the area, but also to set the potential of the low-resistance regions (2) and (3) to either positive or negative polarity. This takes an advantage that the degree of freedom of the relative potential difference between the control electrode (4) and the low-resistance regions (2) and (3). In the structure having the low-resistance region in the bulk, as in the ordinary MOSFET, a current will flow between the element and the substrate unless the bias direction of the junction is constant, although impossible. This discussion likewise applies to the following embodiments.

In the present invention, the carriers are exemplified by the electrons, which may be replaced by the holes. In this case, the relative values of the set voltages of the individual structures in the writing, erasing and reading operations have their signs inverted from those of the case in which the electrons are used as the carriers. Moreover, the low-resistance region 1 (2), the low-resistance region 2 (3) and the control electrode (4) are made of the silicon, which may be replaced by another semiconductor or a metal. The thin film region (1) is made of a non-doped polycrystalline silicon, which may be replaced by another semiconductor material or doped with an impurity. The control electrode (4) overlies the thin film region (1) but may underlie it. In the present embodiment, the thin film region (1) performs the functions to act as the current path between the low-resistance regions and to store the charges for the memory, but may be given only the function to act as the current path between the low-resistance regions, and a charge storage portion for the memory may be added.

In this modification, the charge storage portion may be made of a semiconductor or a metal. Moreover, a SOI (Silicon on Insulator) substrate may be used to form the low-resistance region 1 (2), the low- resistance region 2 (3) or the thin film region (1). This structure is advantageous in a low resistance because the low-resistance region 1 (2), the low-resistance region 2 (3) and the thin film region (1) are made of single-crystal silicon. Another means for reducing the resistance of the low-resistance regions is to shunt the low-resistance regions with a metallic material (e.g., W, TiN, $WSi_2$, MoSi or TiSi), and this method may be adopted. The control electrode may also be shunted with a metallic material so as to have its resistance reduced. These also apply to the following embodiments.

Figure 29A:
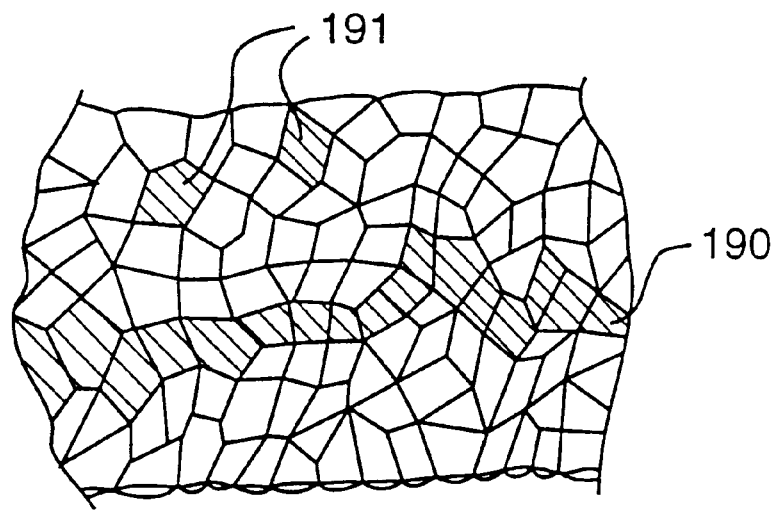
FIG. 29(*a*) is an enlarged view of the thin film of FIG. 29(*b*), showing the low potential regions of the thin film.
Figure 29B:
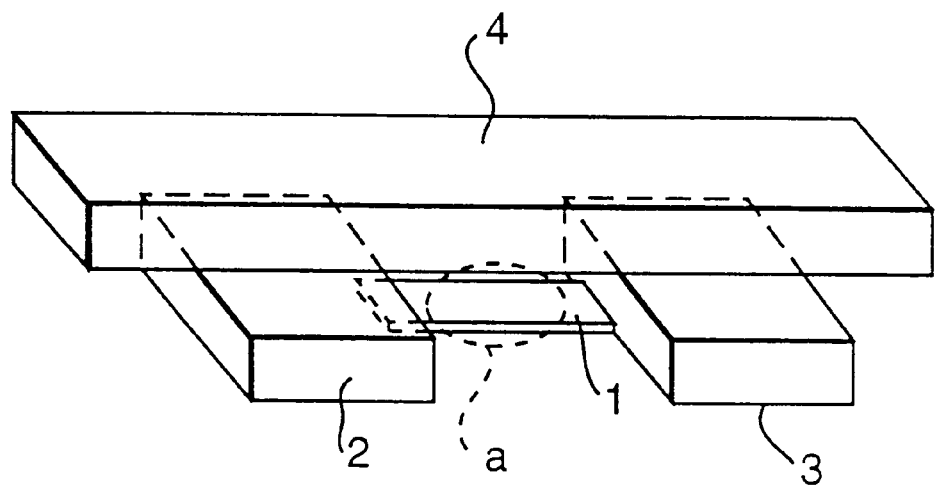

Furthermore, an operational principle of the present embodiment will now be described in connection with FIGS. 29(a) and 29(b). FIG. 29(a) shows an enlarged view of a portion, identified by reference letter a, of the thin film portion of FIG. 29(b). Due to the thickness variation of thin film region 1, which is made of ultra-thin polysilicon, the potential energy varies depending upon the position along region 1. Therefore, under low current conditions, the current path 190 is limited to the low potential region (shown as a hatched portion of FIG. 29(a)) of the film. There are also low potential regions 191 (also shown as hatched portions in FIG. 29(a)) which are isolated from the current path and which act as storage nodes. When the voltage of the control electrode 4 is increased, local electric fields between the current path 190 and the isolated regions 191 are created. Thus, electrons are transferred from the current path 190 to the isolated low potential regions 191 and trapped. Because each isolated region is very small, even a single electron capture causes a large potential change. Therefore, the number of trapped electrons in the isolated regions is stable. Since the current path 190 is very narrow, electron capture effectively affects the current. Thus, stored information can be read by measuring the current value. By applying a low voltage to the control electrode 4, information can be erased because the trapped electrons leave the isolated regions.

More memory can be achieved if the memory elements of the present embodiment are repeatedly arranged. This similarly applies to the memory elements of the following embodiments.

The process for manufacturing the present embodiment will be described with reference to FIG. 5. First of all, the n-type Si substrate (5) has its surface oxidized, and the $Si_3N_4$ film (7) is deposited over the oxidized surface. On this $Si_3N_4$ film (7), there is deposited a highly doped n-type polycrystalline silicon, which works to form the low-resistance region 1 (2) and the low-resistance region 2 (3) (as shown in FIG. 5(*a*)). Moreover, the a-Si is deposited and works to form the thin film region (1) (as shown in FIG. 5(*b*)). After this, the $SiO_2$ is deposited at a temperature of 750. Simultaneously with this, the a-Si is crystallized to the polycrystalline silicon. On this polycrystalline silicon, there is deposited the high-doped n-type polycrystalline silicon, which works to form the control electrode (4) (as shown in FIG. 5(*c*)). After this, an interlayer insulating film (18) is deposited and flattened to reduce the surface roughness and is wired with a metal. As seen from the manufacture process, the LOCOS step is necessary unlike the MOS device using the ordinary bulk, so that the manufacture can be accomplished at a smaller number of steps.

Figure 7A:
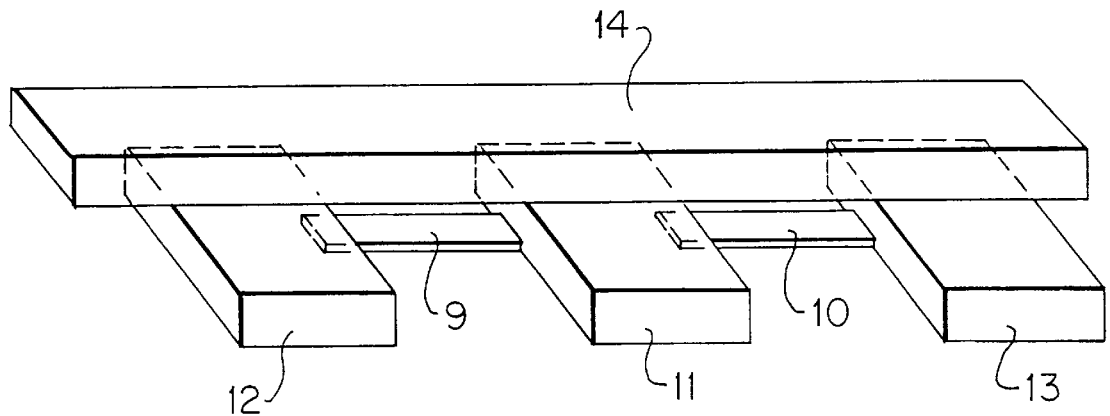
FIGS. 7(*a*) and 7(*b*) are structural diagrams of a semiconductor element of Embodiment 2 of the present invention: where 7(*a*) is a perspective view; and 7(*b*) is a top plan view.
Figure 7B:
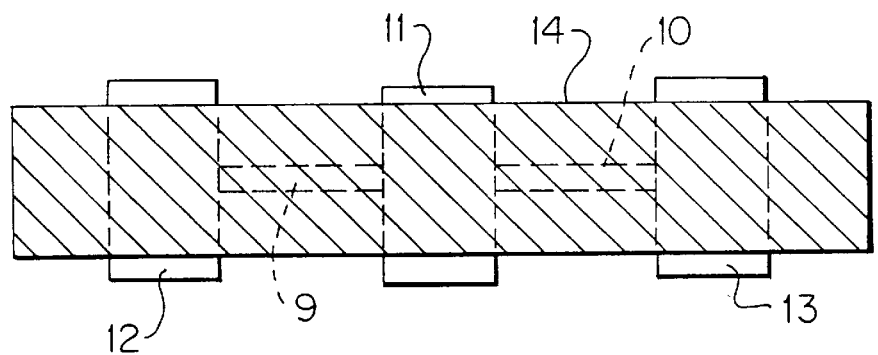

FIG. 7 shows a second embodiment of the present invention. The individual materials of the structure are identical to those of the Embodiment 1 but are characterized in that a low-resistance region 1 (11) connected with a thin film region 1 (9) and a low-resistance region 1 (11) connected with a thin film region 2 (10) are common. By setting the voltages of the low-resistance region 1 (11), the low-resistance region 2 (12), the low-resistance region 3 (14) and the control electrode (14) to predetermined values, only one of the thin film region 1 (9) and the thin film region 2 (10) can have its information written, erased and read out. In the writing operation of the thin film region 1 (9), the low-resistance region 1 (23) is set to a low potential (e.g., 0 V) whereas the low-resistance region 2 (12) and the low-resistance region 3 (13) are set to higher potentials (e.g., both 5 V), and the control electrode (14) is set to a predetermined high potential Vw (e.g., 10 V). If the time period for the high potential Vw to be applied is set within a constant, the thin film region 2 (10) is not written. Incidentally, if the low-resistance region 3 (4) has its potential set to a potential (0 V) as low as that of the low-resistance region 1 (11), both the thin film region 1 (9) and the thin film region 2 (10) can be simultaneously written.

In the operation of erasing the memory information of the thin film region 1 (9), the low-resistance region 2 (12) and the low-resistance region 3 (13) are set to low potentials (e.g., both 0 V) whereas the low-resistance region 1 (23) may be set to a higher potential (e.g., 5 V), and the control electrode (14) may be set to a predetermined low potential Ve (e.g., −5 V). If the application time period of the low potential Ve is set within a constant time period, the information of the thin film region 2 (10) is not erased. When erasing, the potential of the low-resistance region 2 (12) can be set to the same potential of the low-resistance region 1 (23) as in the writing operation, to effect the block erase of the thin film region 1 (9) and the thin film region 2 (10).

The present embodiment can store twice the information as that of the memory element of the Embodiment 1 and is featured in that it can be manufactured with a smaller area than that of the Embodiment 1, in which the two memory elements are spaced from each other.

Figure 8A:
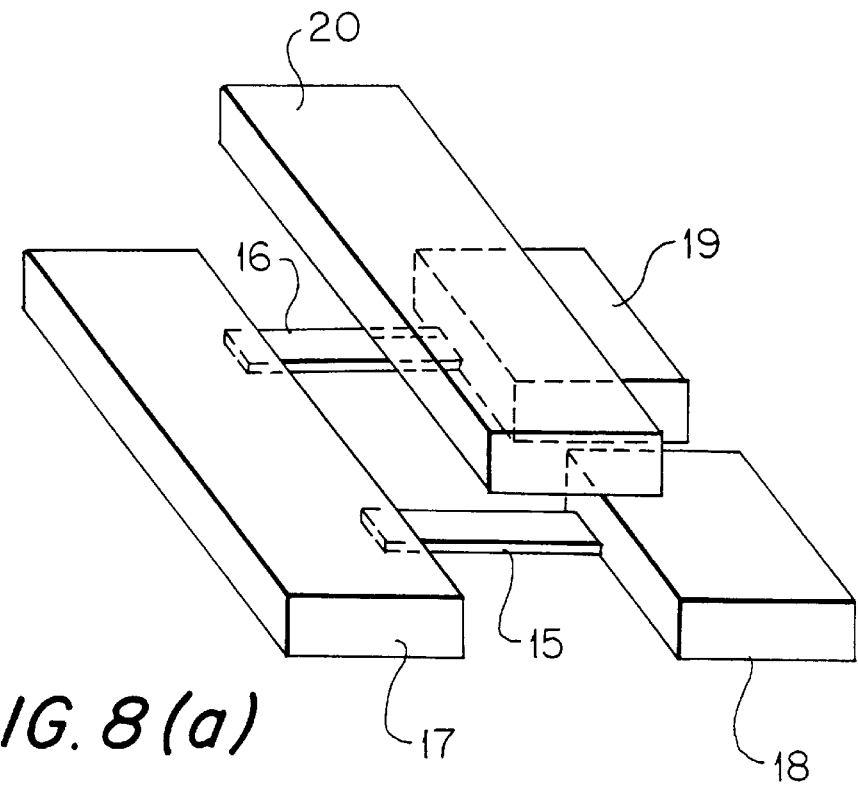
FIGS. 8(*a*) and 8(*b*) are structural diagrams of a semiconductor element of Embodiment 6 of the present invention: where 8(*a*) is a perspective view; and 8(*b* ) is a top plan view.
Figure 8B:
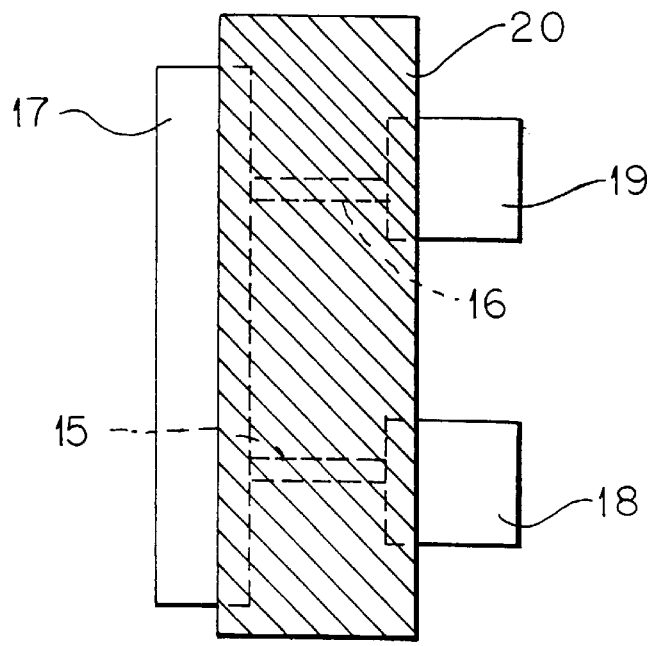

FIG. 8 shows a third embodiment of the present invention. This embodiment is similar to the Embodiment 2 in the materials of the individual portions and in that the memory element is composed of two thin film regions (15) and (16), three low-resistance regions (17) to (19) and one control electrode (20), but is different in that the two thin film regions (15) and (16) are located at the same side of the common low-resistance region 1 (17) and in that the longitudinal direction of the control electrode (20) and the longitudinal direction of the common low-resistance region 1 (17) are in parallel. The information is written and erased as in the Embodiment 2. Thanks to the use of the common low-resistance region 1 (17), the memory element is featured in that can be manufactured with a small area. Since, moreover, the control electrode and the common low-resistance region 1 (17) are in parallel so that the control electrode does not pass over the common low-resistance region 1 (17), the memory element is further featured in that it is reluctant to be influenced by the potential fluctuation of the control electrode.

FIG. 4 shows a fourth embodiment of the present invention. The present embodiment is identical to the Embodiments 2 and 3 in the number of the thin film regions but is different in that the control electrodes are two (26) and (27) in number and in that the low-resistance regions are only two (23) and (24). As a result, the present embodiment is featured in that the number of contacts may be small to reduce the area to be occupied by the low-resistance regions. Like before, the low-resistance region 1 (23), the low-resistance region 2 (24) and the control electrodes (26) and (27) are made of doped polycrystalline silicon, and a thin film region 1 (21) and a thin film region 2 (22) are made of non-doped polycrystalline silicon. The method of writing and erasing the information of the present embodiment is similar to that described earlier at the beginning of the Detailed Description section of this specification.

Figure 21A:
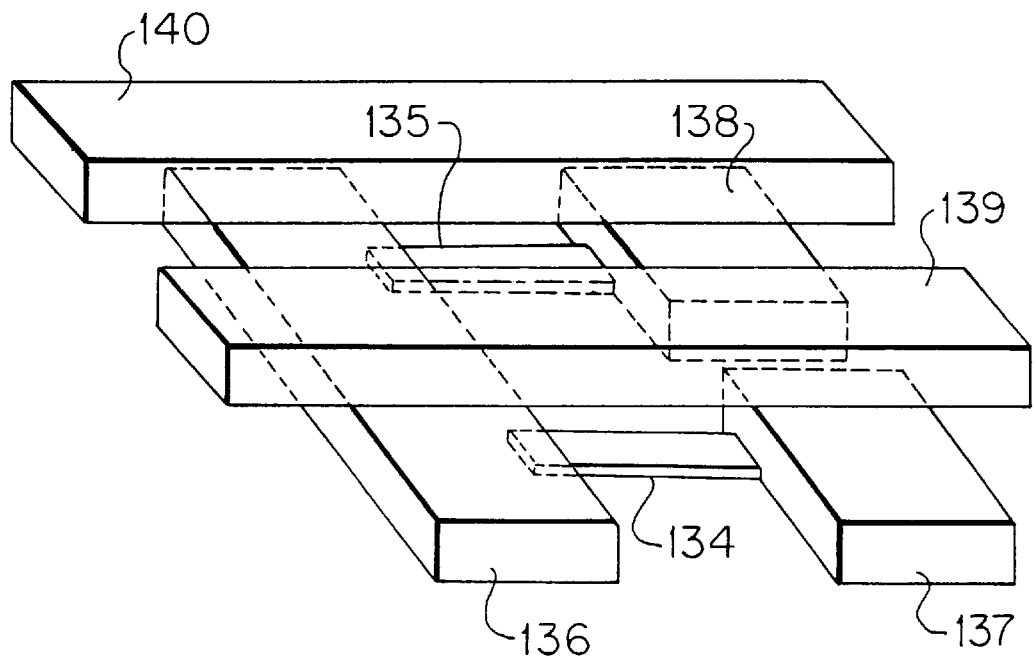
FIGS. 21(*a*) and 21(*b*) are structural diagrams of a semiconductor element of Embodiment 5 of the present invention: where 21(*a*) is a perspective view; and 21(*b*) is a top plan view.
Figure 21B:
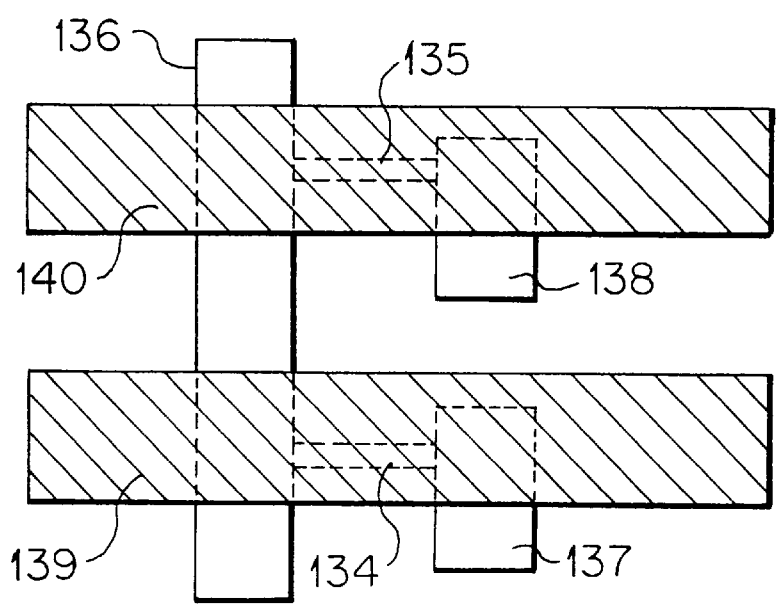

FIG. 21 shows a fifth embodiment of the present invention. The present embodiment is composed of two thin film regions 1 (134) and 2 (135), three low-resistance regions 1 to 3 (136) to (138) and two control electrodes (139) and (140). Here, the designation of the "low-resistance regions 1 to 3 (136) to (138)" implies that the low-resistance region 1 (136) corresponds to (136), the low-resistance region 2 corresponds to (137), and the low-resistance region 3 corresponds to (138), and this designation applies to the following. The present embodiment has its structure modified from the Embodiment 4 such that the low-resistance region 2 (24) is divided into the low-resistance region 2 (137) and low-resistance region 3 (138). These low-resistance region 2 (137) and the low-resistance region 3 (138) are connected with wiring lines of other layers through contract holes. If the material of the wiring lines of other layers is selected, it is possible to realize a low-resistance element. Moreover, the low-resistance region 1 (135) may also be divided and connected with wiring lines of other layers.

Figure 9A:
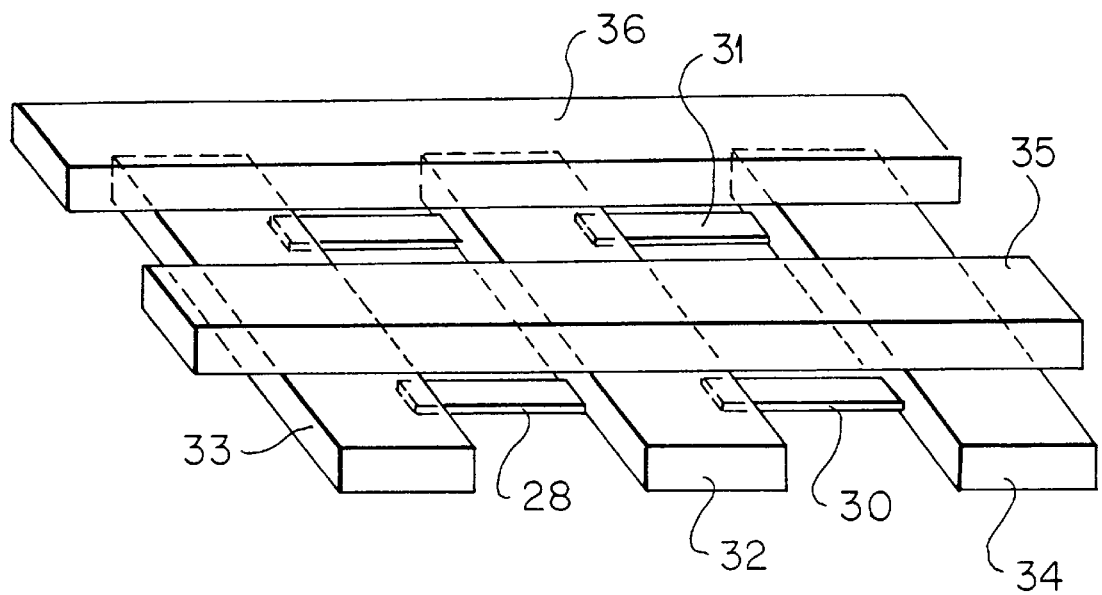
FIGS. 9(*a*) and 9(*b*) are structural diagrams of a semiconductor element of Embodiment 6 of the present invention: where 9(*a*) is a perspective view; and 9(*b*) is a top plan view.
Figure 9B:
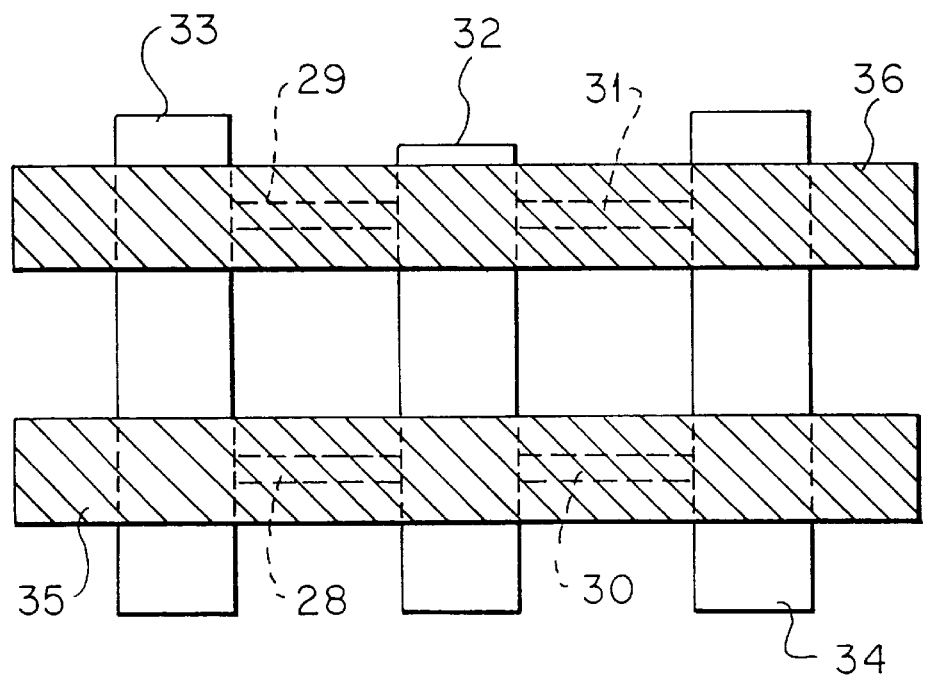

FIG. 9 shows a sixth embodiment of the present invention. The present memory element stores information of 4 bits or more. This memory element is composed of four thin film regions 1 to 4 (28) to (31), three low-resistance regions 1 to 3 (32) to (34) and two control electrodes (35) and (36). Both the first thin film region and the second thin film region connect the first (32) and second (33) low-resistance regions, and both the third thin film region and the fourth thin film region connect the first (32) and third (34) low-resistance regions. The first control electrode (35) is formed to cover the first thin film region (28) and the third thin film region (30), and the second control electrode (36) is formed to cover the second thin film region (29) and the fourth thin film region (31). Thanks to the use of the common low-resistance region 1 (32), the gap between the low-resistance region 2 (33) and the low-resistance region 3 (34) can be reduced to manufacture the memory elements with a small area. Since no contact is required for each thin film region, the present structure is featured in that its area can be reduced and in that a stacked structure having longitudinal repetitions can be easily made.

In the writing operation of the thin film region 1 (28), the low-resistance region 2 (33) is set to a low potential (e.b., 0 V), the low-resistance region 1 (32) and the low-resistance region 3 (34) are set to a higher potential (e.g., both 5 V), and the control electrode 1 (35) is set to a predetermined high potential Vw (e.g., 10 V). The potential of the control electrode 2 (36) is not set to a high potential (but to 5 V, for example). At this time, the thin film region 2 (29), the thin film region 3 (30) and the thin film region 4 (31) are not written. Incidentally, if the potential of the low-resistance region 3 (34) is set to a potential (0 V) as low as that of the low-resistance region 2 (33), the thin film region 1 (28) and the thin film region 3 (30) can be simultaneously written.

In the erasing operation, the stored information of the thin film region 1 (28) is erased by setting the low-resistance region 1 (32) and the low-resistance region 3 (34) to a predetermined low potential (e.g., both 0 V), the low-resistance region 2 (33) to a higher potential (e.g., 5 V), and the control electrode 1 (35) to a predetermined low potential Ve (e.g., −5 V). The control electrode 2 (36) is not set to a low potential (but to 5 V, for example). However, the application of the high potential Vw and the low potential Ve is within a constant time period. At this time, the information of the thin film region 2 (29), the thin film region 3 (30) and the thin film region 4 (31) are not erased. When erasing, as in the writing operation, the thin film region 1 (28) and the thin film region 3 (30) can be block-erased by setting the potential of the low-resistance region 3 (34) to the same potential as that of the low-resistance region 2 (33). The information block writing and erasing operations to be controlled such identical control electrodes are especially effective for the many memories using the present structure repeatedly, so that the time periods for the writing and erasing operations can be drastically shortened.

These voltage settings are essentially identical in the following embodiments, too. In the structure having the control electrodes (35) and (36) overlying the thin film regions (28) to (31), as in the present structure, the information of the thin film regions 1 to 4 (28) to (31) can be written and erased in a block by raising or lowering the potential of the substrate. This is similar to other embodiments taking the structure, in which the control electrodes (35) and (36) overlie the thin film regions (28) to (31). The reading of the information of the thin film region 1 is effected such that the conductance of the thin film region 1 (28) by applying a potential difference between the low-resistance region 1 (32) and the low-resistance region 2 (33), by setting the control electrode 2 (36) to a predetermined low potential the control electrode 1 (35) to a reading potential Vr higher than that of the control electrode 2 (36), and by metering the value of the current to flow between the low-resistance region 1 (32) and the low-resistance region 2 (33). The information of only the thin film region 1 (28) can be read out by setting the control electrode 2 (36) to such a low potential that the individual thin film regions are at low conductances so that information might be stored in the individual thin film regions.

Figure 24:
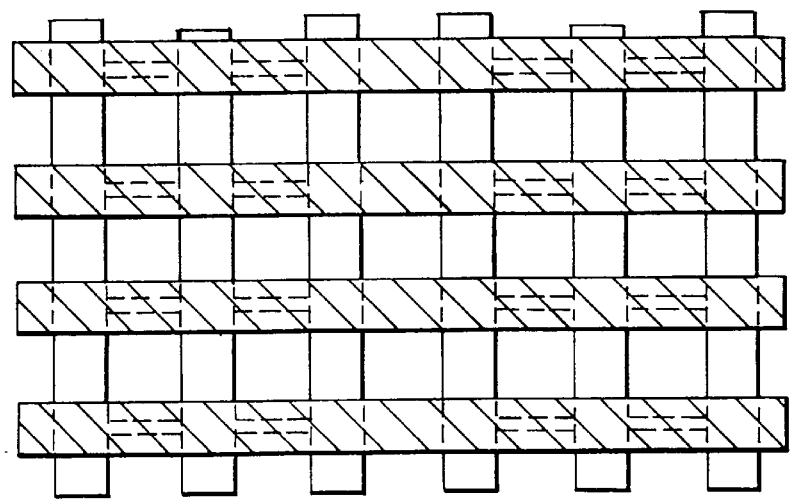
FIG. 24 is top plan view of the element for storing 16 bits by repeatedly using the structure of the semiconductor element of Embodiment 6 of the present invention.
Figure 25:
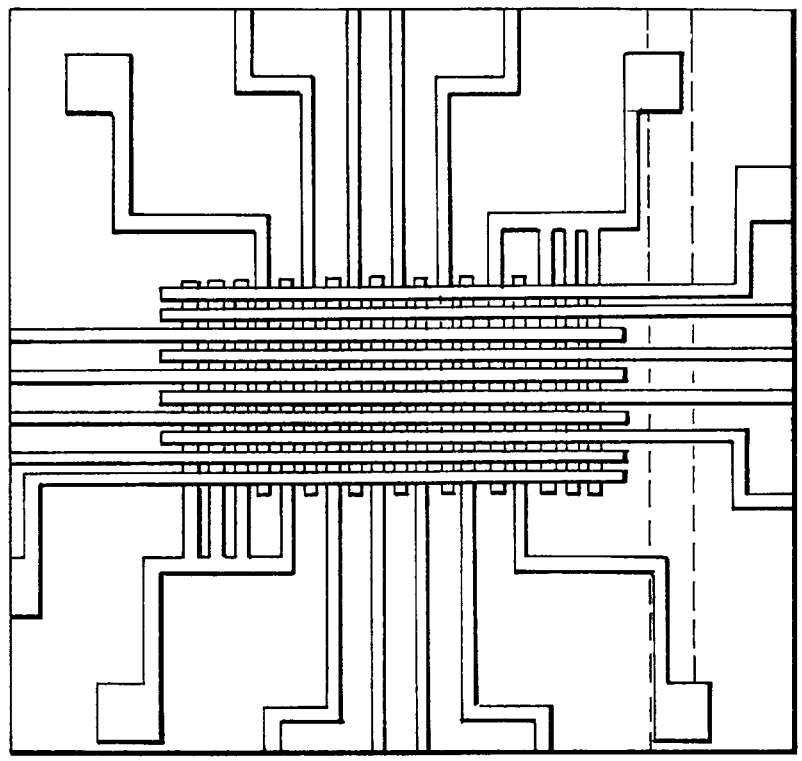
FIG. 25 illustrates a prototype element having memory cells of 120 bits by repeatedly using the structure of the semiconductor element of Embodiment 6 of the present invention.

In FIG. 24, there is shown a structure in which four present structures are repeatedly arranged to have sixteen thin film regions. In FIG. 25, moreover, there is presented an illustration of a prototype element which is prepared by arranging the present structures repeatedly and by arranging memory cells of 120 bits in a matrix. In the photograph, ten control electrodes run transversely. Six sets of three low-resistance regions run longitudinally (which correspond to the low-resistance regions 1 to 3 such that two of them correspond to the thin film regions 1 and 2 for one control electrode). There are arranged 10×6×2=120 thin film regions. In this large-scale memory, the writing, erasing and reading methods can be accomplished basically in an identical manner.

In this memory, two sets of three low resistance regions (dummy lines) of both edges in a transverse direction and a control electrode of each edge in a longitudinal direction act as a buffer. Of course, the two sets of three low resistance regions could be two sets of one low resistance region. The potential of these buffer lines are kept at a fixed value, such as ground. Therefore, this memory actually stores 64 bits. It is well known that the same designed lines often have different shapes after formation when their density of patterns are different. Using the buffer structure like this embodiment, shape differences between memory elements and therefore electrical characteristic differences between bits can be reduced. the ratio of buffer area to memory area decreases as memory sized increases. Thus, the use of this buffer structure does not adversely affect integration in any great amount.

Figure 10A:
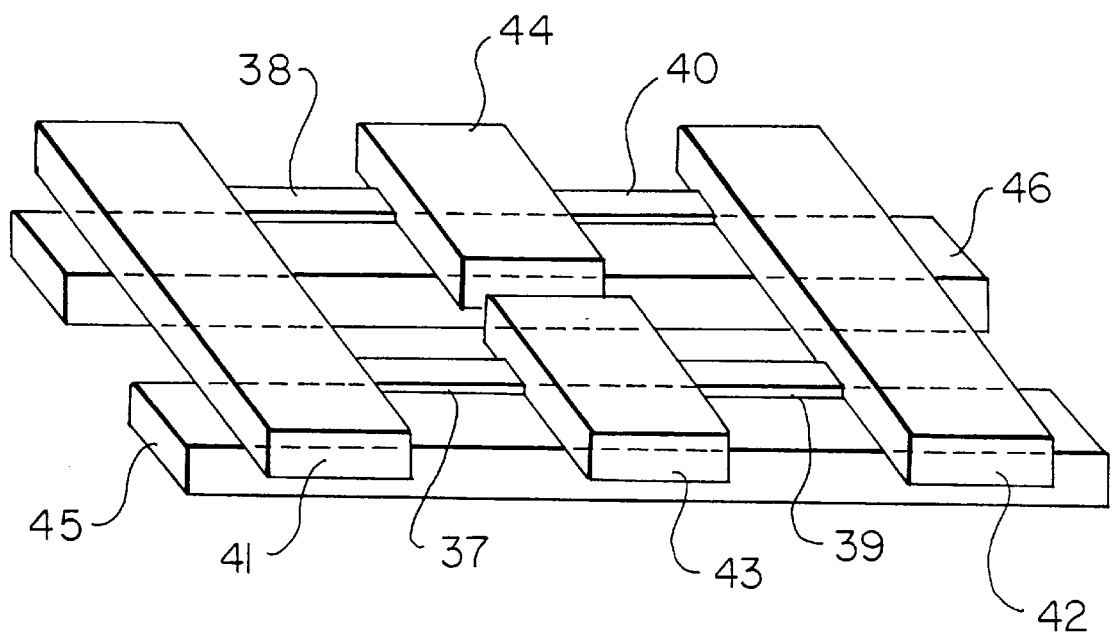
FIGS. 10(*a*) and 10(*b*) are a structural diagrams of a semiconductor element of Embodiment 7 of the present invention: where 10(*a*) is a perspective view; and 10(*b*) is a top plan view.
Figure 10B:
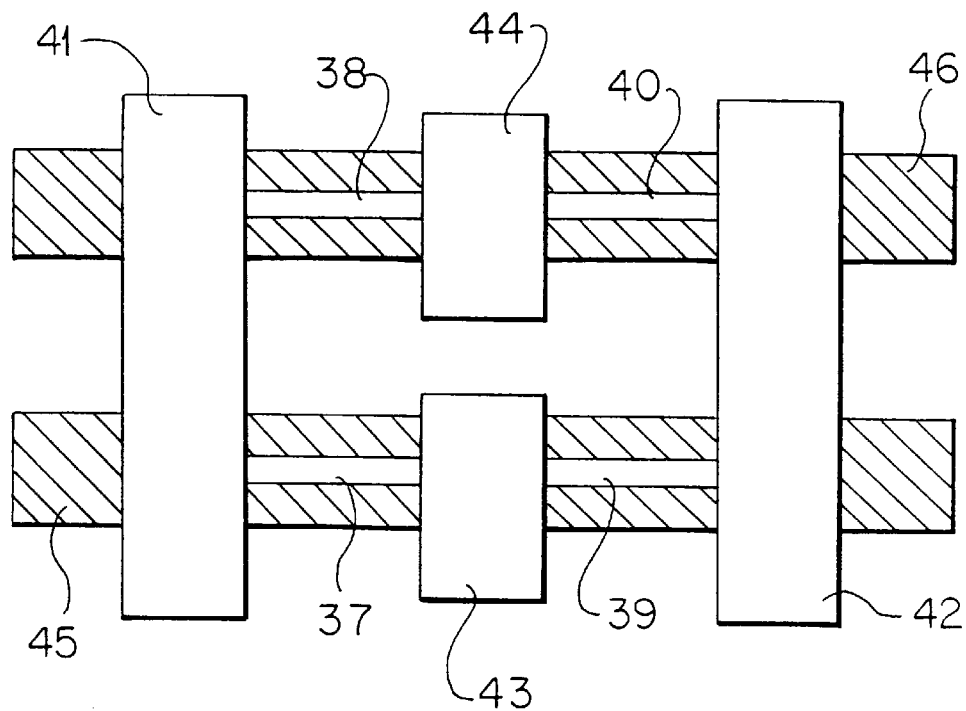

FIG. 10 shows a seventh embodiment of the present invention. This embodiment has four thin film regions 1 to 4 (37) to (40), four low-resistance regions 1 to 4 (41) to (44) and two control electrodes (45) and (46). The embodiment is similar to the Embodiment 5 in that the four thin film regions are formed to store an information of 4 bits or more and in the writing and erasing method. This embodiment is different from the Embodiment 6, in which both the two low-resistance regions connected with the thin film region 1 and the thin film region 2 are shared, in that the low-resistance regions are made separate and wired with a metal through contact holes. Another difference resides in that the control electrodes (45) and (46) are formed below the thin film regions (37) and (40). The present embodiment is featured by that the resistance can be reduced by shunting the metallic wiring. Moreover, the construction can be modified such that the low-resistance region 3 (43) and the low-resistance region 4 (44) are not metallically wired but the metal wire are extended in parallel with the control electrodes. This structure is featured in that the thin film regions have their potentials stabilized against the external noises because its portion over the thin film regions is covered with the metal wires whereas the lower portion is covered with the control electrodes. Since the control electrodes are formed below the thin film regions, the overlapping portions between the control electrodes and the low-resistance regions and the contact holes can overlap each other.

Figure 11A:
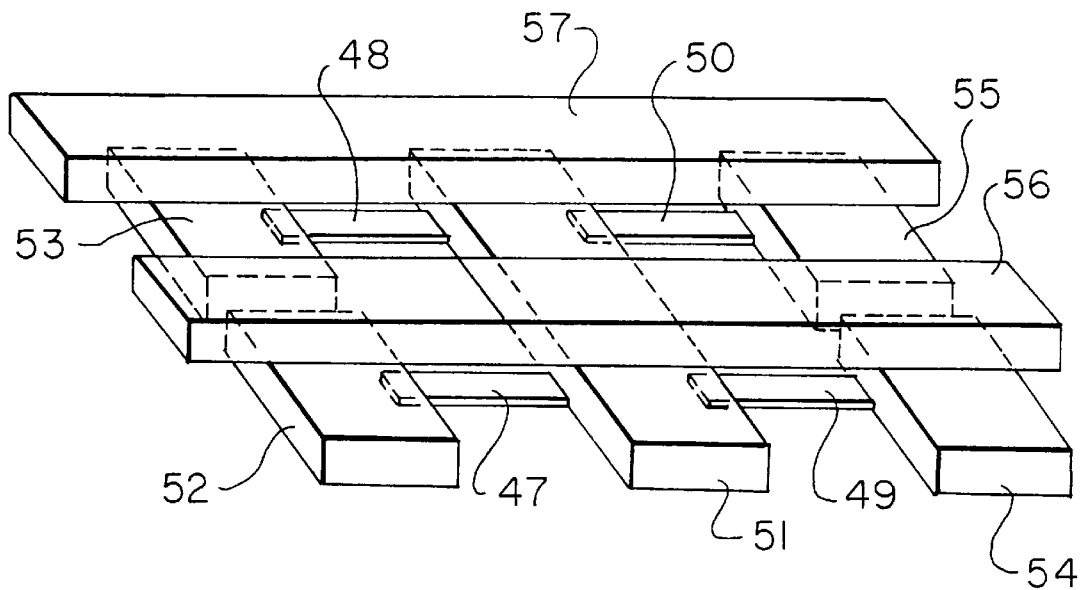
FIGS. 11(*a*) and 11(*b* ) are structural diagrams of a semiconductor element of Embodiment 8 of the present invention: where 11(*a*) is a perspective view; and 11(*b*) is a top plan view.
Figure 11B:
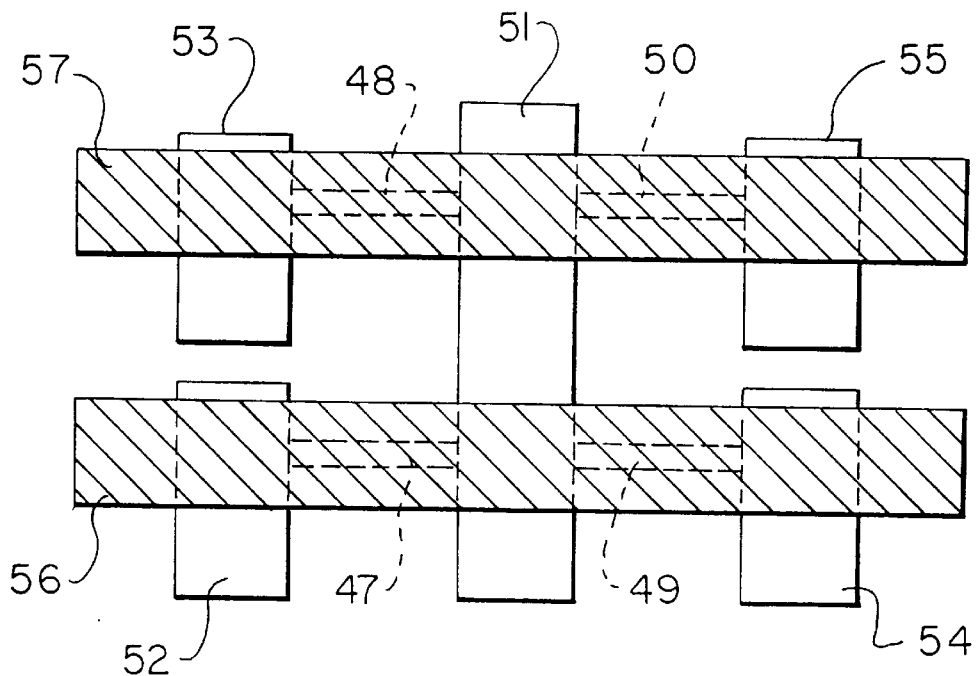

FIG. 11 shows an eighth embodiment of the present invention. This embodiment has four thin film regions 1 to 4 (47) to (50), five low-resistance regions 1 to 5 (51) to (55) and two control electrodes (56) and (57). The present invention is different from the Embodiment 7 in what low-resistance region of the Embodiment 6 is divided and connected with the metal wiring lines and in the vertical relations between the thin film regions and the control electrodes. The present structure is effective in the case of operations in which the potentials of the low-resistance regions 2 to 5 (52) to (55) are highly changed. Moreover, the low-resistance region 1 (51) may be divided, and the divided regions may be connected with each other through the wiring line of another layer.

Figure 12A:
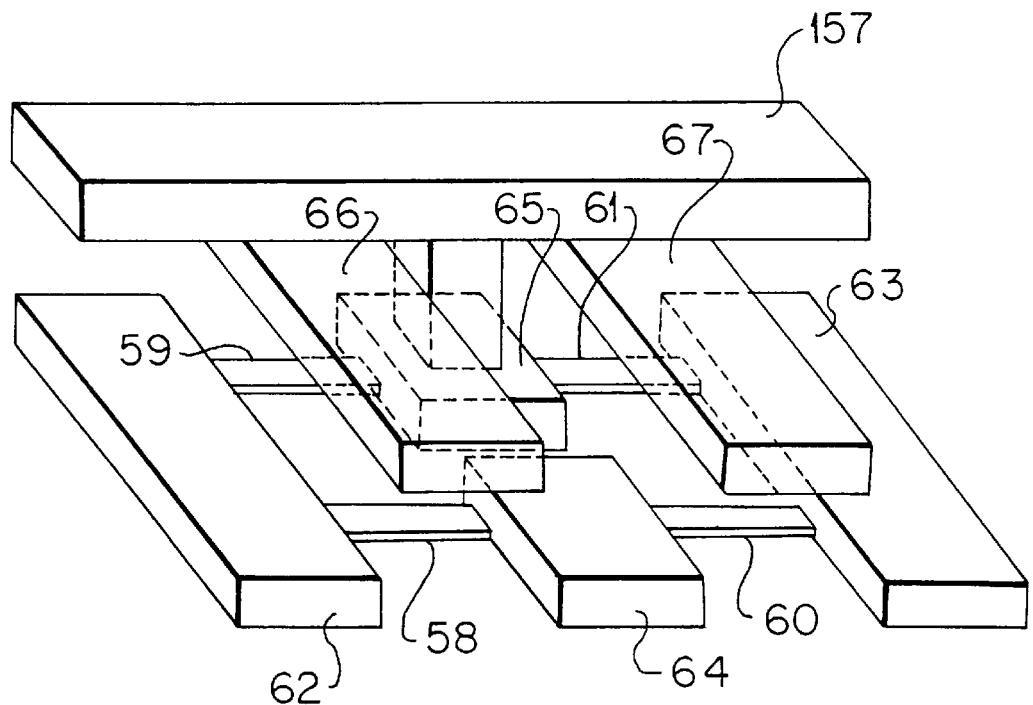
FIGS. 12(*a*) and 12(*b*) are structural diagrams of a semiconductor element of Embodiment 9 of the present invention: where 12(*a*) is a perspective view; and 12(*b*) is a top plan view.
Figure 12B:
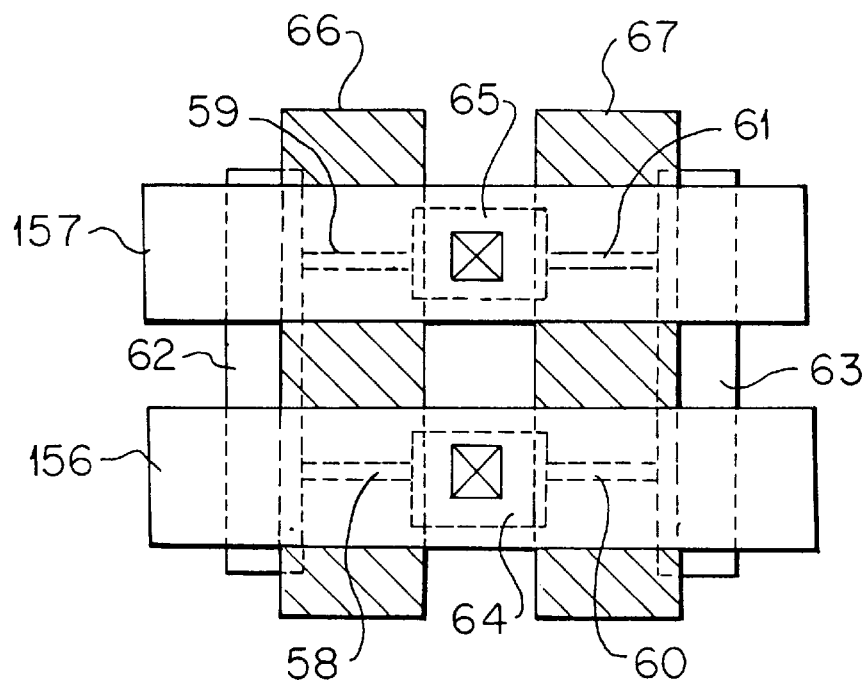

FIG. 12 shows a ninth embodiment of the present invention. A first thin film region (58) connects a first low-resistance region (62) and a third low-resistance region (64); a second thin film region (59) connects the first low-resistance region (62) and a fourth low-resistance region (65); a third thin film region (60) connects a second thin film region (63) and the third low-resistance region (64); and a fourth thin film region (61) connects the second low-resistance region (63) and the fourth low-resistance region (65). A first control electrode (66) is formed to cover the first thin film region (58) and the second thin film region (59), and a second control electrode (67) is formed to cover the third thin film region (60) and the fourth thin film region (61). According to the present structure, it is impossible unlike the Embodiment 6 to write and erase the information separately in and from the individual thin film regions (58) to (61) if the third low-resistance region (64) and the fourth low-resistance region (65) are united. The low-resistance region 3 (64) is connected with a low-resistance region 5 (156) of W of another layer whereas the low-resistance region 4 (65) is connected with a low-resistance region 6 (157) of the same layer as that of the low-resistance region 5 (156) of W, and they are separately controlled. The material of the low-resistance region 5 (156) and the low-resistance region 6 (157) may be other than W if it has a low resistance.

In the present embodiment, the longitudinal direction of the control electrodes (66) and (67) and the longitudinal direction of the low-resistance region 5 (156) and the low-resistance region 6 (157) are substantially perpendicular to each other. However, the longitudinal directions of the low-resistance region 5 (156) and the low-resistance region 6 (157) may be in parallel with each other but need not be perpendicular to the longitudinal direction of the control electrodes (66) and (67). The present embodiment is featured in that it is reluctant to be influenced by the potential fluctuations of the control electrode (66) and (67) because these control electrodes (66) and (67) intersect neither of the common low-resistance region 1 (62) and low-resistance region 2 (63).

Figure 13A:
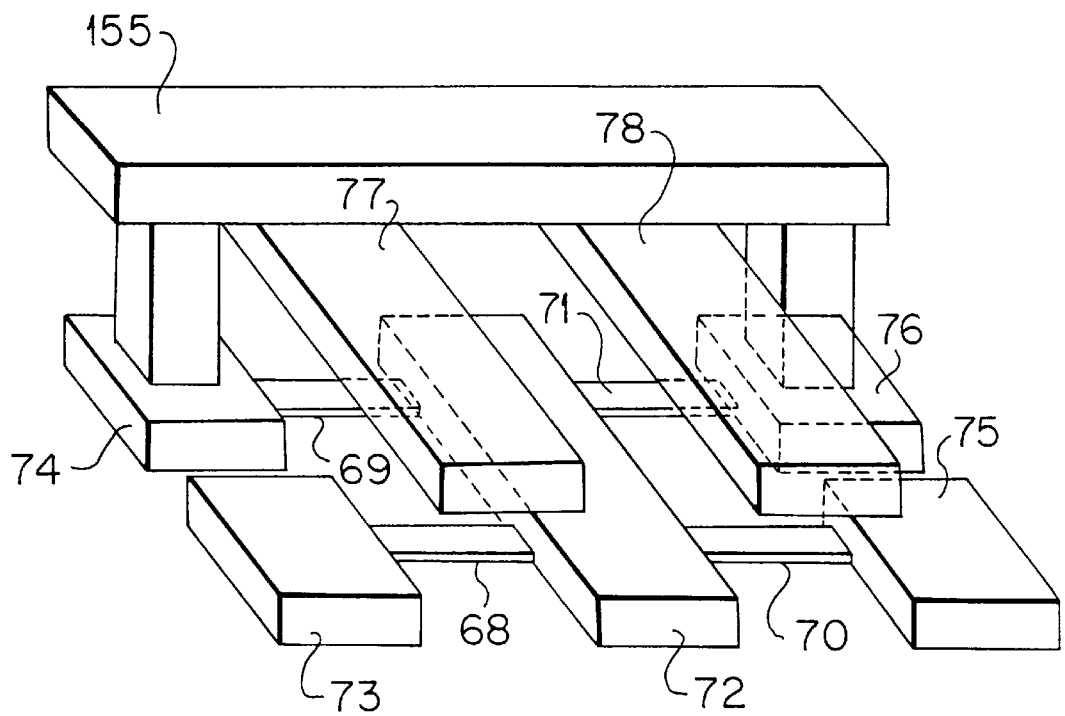
FIGS. 13(*a*) and 13(*b*) are structural diagrams of a semiconductor element of Embodiment 10 of the present invention: where 13(*a*) is a perspective view; and 13(*b*) is a top plan view.
Figure 13B:
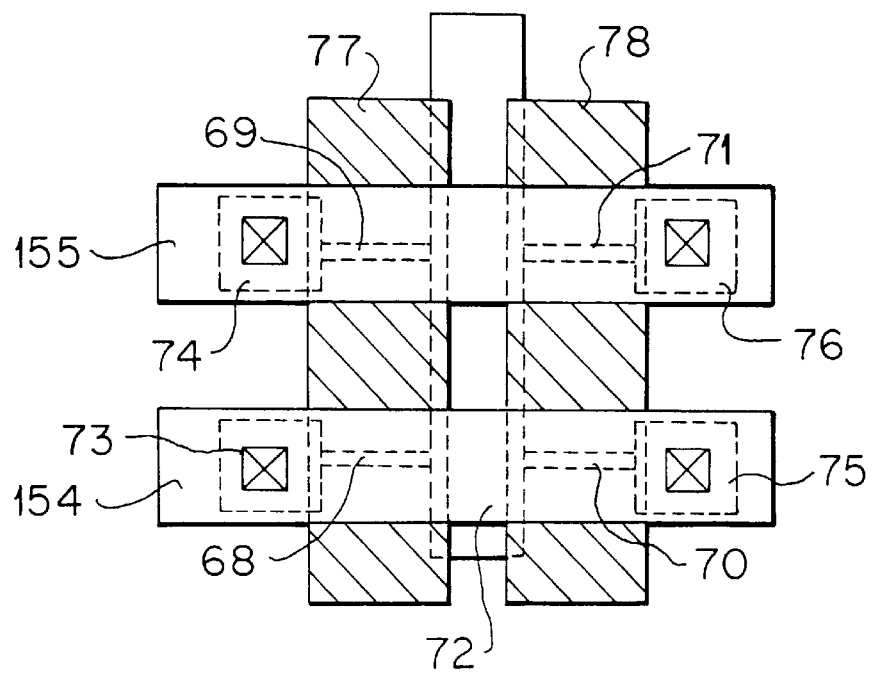

FIG. 13 shows a tenth embodiment of the present invention. This embodiment has four thin film regions 1 to 4 (68) to (71), five low-resistance regions 1 to 5 (72) to (76) and two control electrodes (77) and (78). The present embodiment is modified from the Embodiment 9 by connecting the low-resistance region 3 (64) and the low-resistance region 4 (65) through an identical material and by dividing the low-resistance region 1 (62) and the low-resistance region 2 (63) individually. The low-resistance region 2 (73) and the low-resistance region 4 (75) are connected through a low-resistance region 6 (154) of another layer of W, and the low-resistance region 3 (74) and the low-resistance region 5 (76) are connected through a low-resistance region 7 (155) of the same layer as that of the low-resistance region 6 (154) of W.

Figure 26:
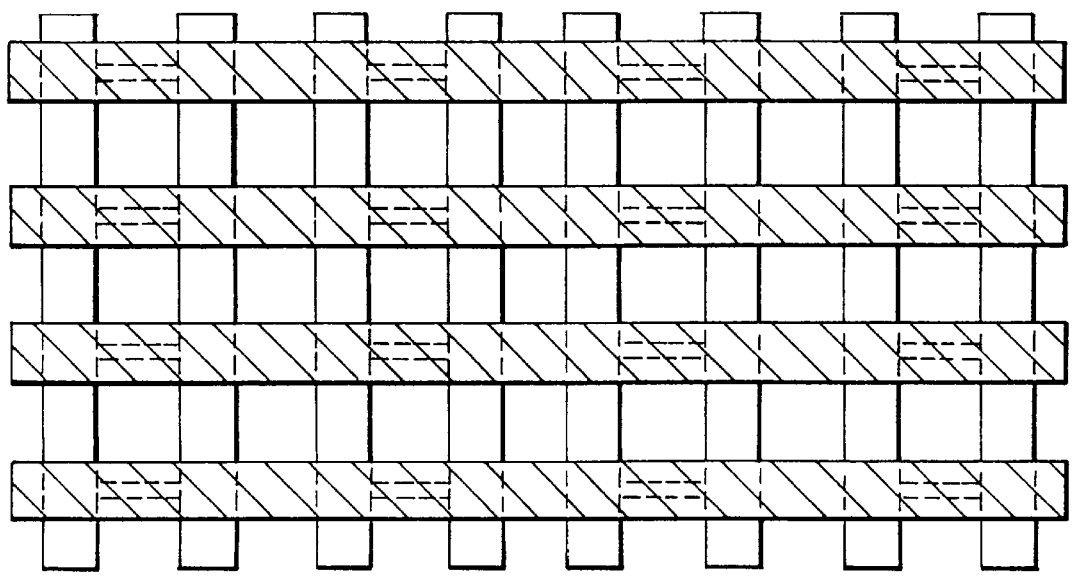
FIG. 26 is a top plan view of the element for storing 16 bits by repeatedly using the structure of the semiconductor element of Embodiment 11 of the present invention.

FIG. 14 shows an eleventh embodiment of the present invention. This embodiment has the four thin film regions 1 to 4 (79) to (82), the four low-resistance regions 1 to 4 (83) to (86) and the two control electrodes (87) and (88). The embodiment is different from the sixth embodiment in that the thin film region 1 (79), the thin film region 2 (80), the thin film region 3 (81) and the thin film region 4 (82) do not have their low-resistance regions shared. The present embodiment has a larger area than that of the sixth embodiment but has all the remaining features. The present embodiment is featured over the sixth embodiment in that the low-resistance regions are made independent so as to increase the degree of freedom for setting the voltages thereby to decrease the influences upon the thin film region 3 (81) and the thin film region 4 (82) at the times of writing and erasing the thin film region 1 (79) and the thin film region 2 (80), and in that it is suited for the stable operations. The writing and erasing methods in the memory element of the present embodiment are identical to those which have been described earlier at the beginning of the Detailed Description portion of this Specification. In FIG. 26, there is shown an element for the storage of 16 bits or more by using the present structure repeatedly.

Figure 19A:
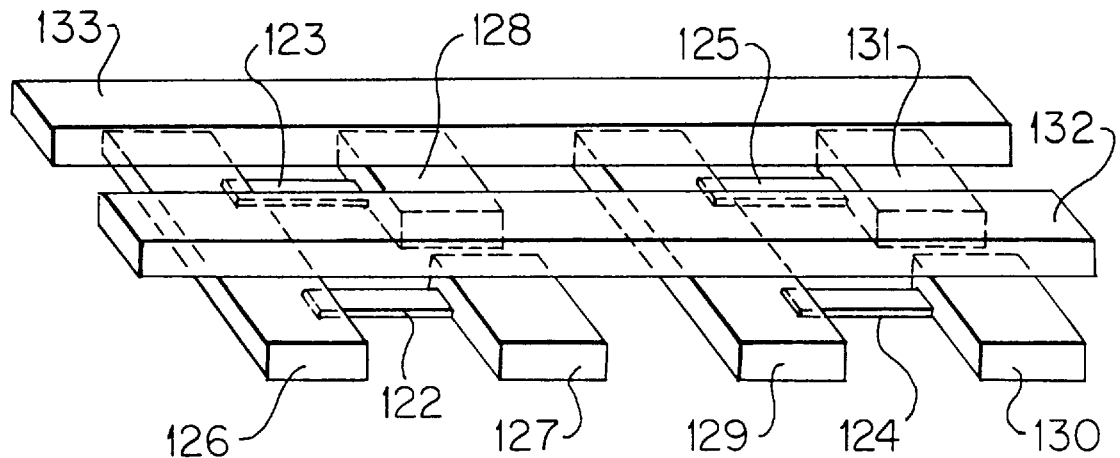
FIGS. 19(*a*) and 19(*b*) are structural diagrams of a semiconductor element of Embodiment 12 of the present invention: where 19(*a*) is a perspective view; and 19(*b*) is a top plan view.
Figure 19B:
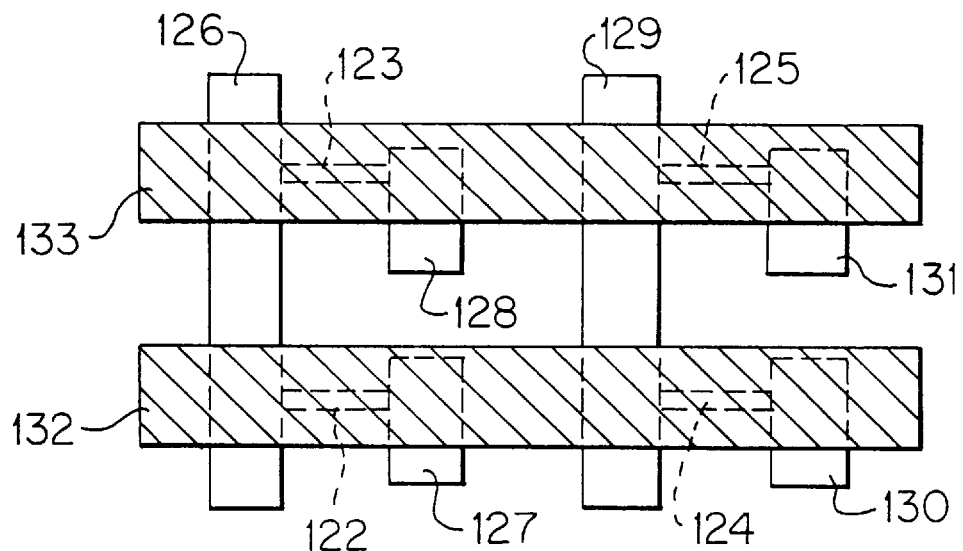

FIG. 19 shows a twelfth embodiment of the present invention. This embodiment has four thin film regions 1 to 4 (1229 to (125), six low-resistance regions 1 to 4 (126) to (131) and two control electrodes (132) and (133). The structure is similar to that which is modified from the fourth embodiment such that the two structures of the halved low-resistance region 2 (24) are juxtaposed to share the control electrode. The present structure is an element for storing 4 bits or more, as in the seventh and eighth embodiments, but has a larger area than those of the seventh and eighth embodiments. Like the Embodiment 11, the present structure is featured in that the low-resistance regions are made so independent as to increase the degree of freedom for setting the voltages thereby to decrease the influences upon the thin film region 3 (124) and the thin film region 4 (125) at the times of writing and erasing the thin film region 1 (122) and the thin film region 2 (123), and in that it is suited for the stable operations. In the present structure, the low-resistance region 3 (128) and the low-resistance region 4 (1299 are adjacent to each other, but the low-resistance region 2 (127) and the low-resistance region 3 (128), and the low-resistance region 5 (130) and the low-resistance region 6 (131) may be adjacent to each other. This modified structure is also featured in that the voltages of the individual portions in the operations can be easily set.

Figure 15A:
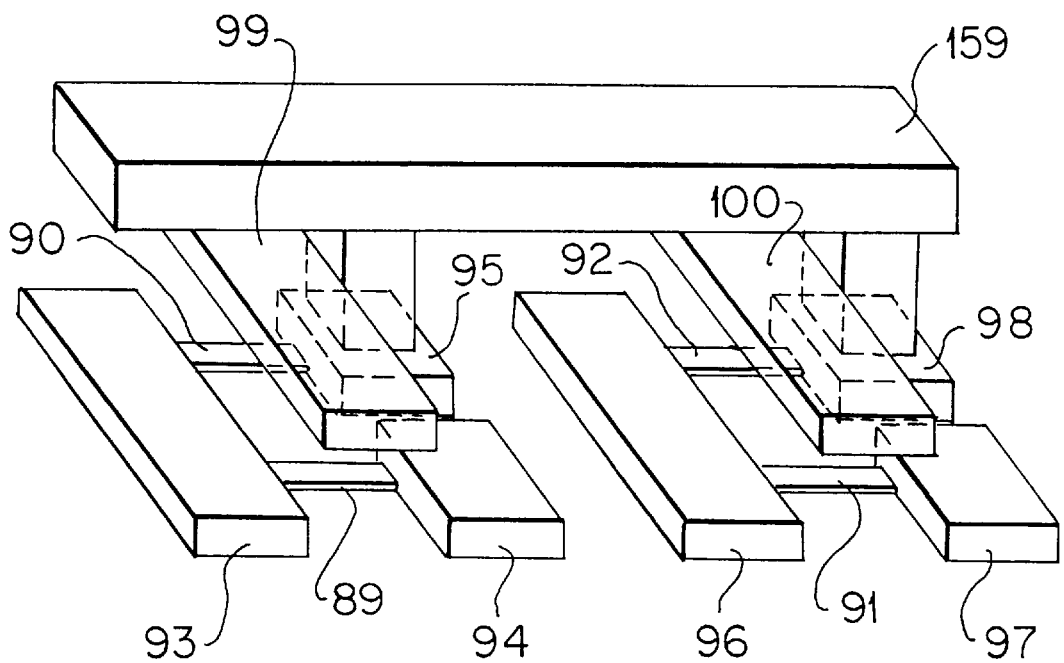
FIGS. 15(*a*) and 15(*b*) are structural diagrams of a semiconductor element of Embodiment 13 of the present invention: where 15(*a*) is a perspective view; and 15(*b*) is a top plan view.
Figure 15B:
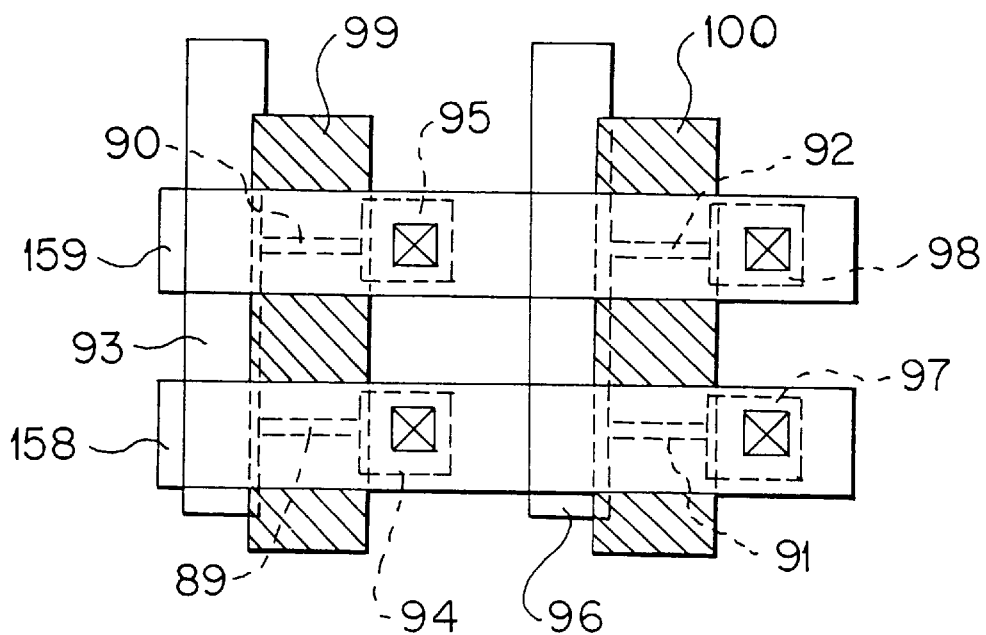

FIG. 15 shows a thirteenth embodiment of the present invention. This embodiment is different from the ninth embodiment in that a thin film region 1 (89) and a thin film region 3 (91), and a thin film region 2 (90) and a thin film region 4 (92) do not have their low-resistance regions shared. A low-resistance region 7 (158), which belongs to a layer other than that forming a low-resistance region 2 (94), a low-resistance region 3 (95), a low-resistance region 5 (97) and a low-resistance region 6 (98), is used to connect the low-resistance region 2 (94) and the low-resistance region 5 (97), and a low-resistance region 8 (159) belonging to the same layer as that of the low-resistance region 7 (158) is used to connect the low-resistance region 3 (95) and the low-resistance region 6 (98). The present embodiment has a larger area than that of the ninth embodiment but is featured in that the thin film region 3 (91) and the thin film region 4 (92) are less influenced to stabilize the operations at the time of writing and erasing the thin film region 1 (89) and the thin film region 2 (90).

Figure 16A:
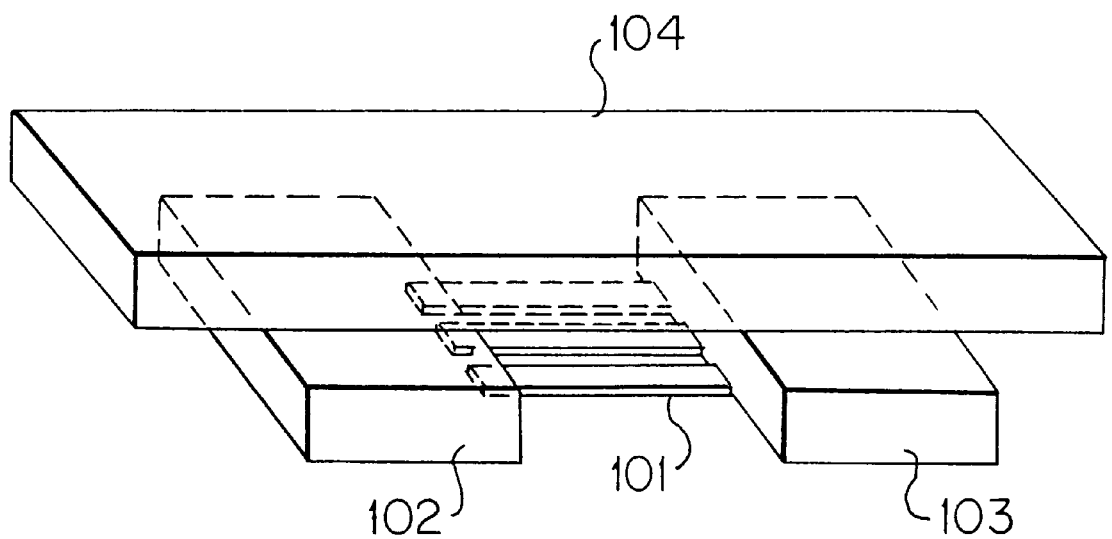
FIGS. 16(*a*) and 16(*b*) are structural diagrams of a semiconductor element of Embodiment 14 of the present invention: where 16(*a*) is a perspective view; and 16(*b*) is a top plan view.
Figure 16B:
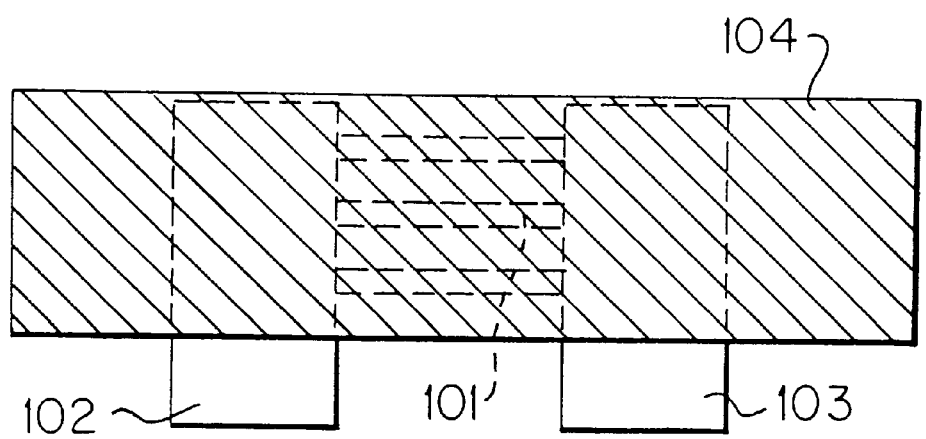
Figure 20A:
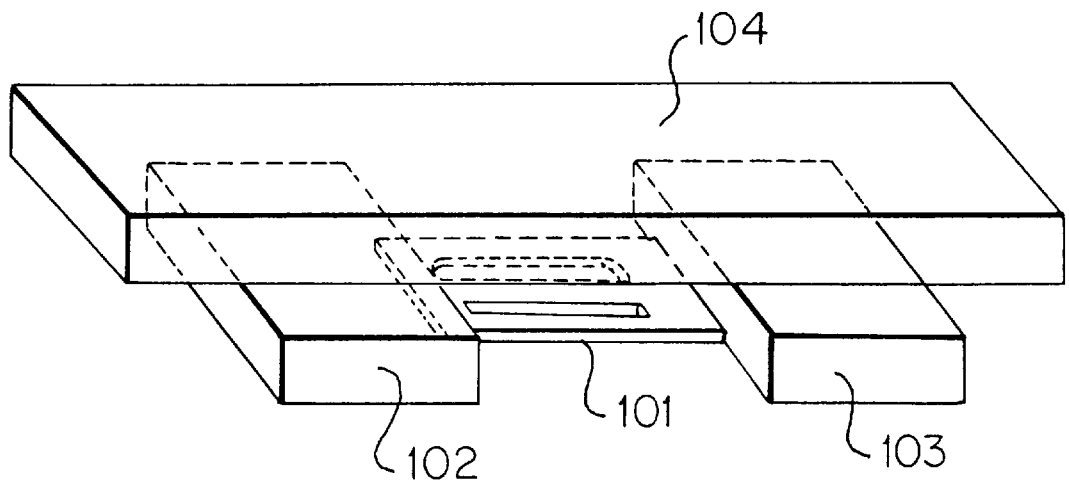
FIGS. 20(*a*) and 20(*b*) are diagrams showing a structure substantially equivalent to a semiconductor element of Embodiment 14 of the present invention: where 20(*a*) is a perspective view; and 20(*b*) is a top plan view.
Figure 20B:
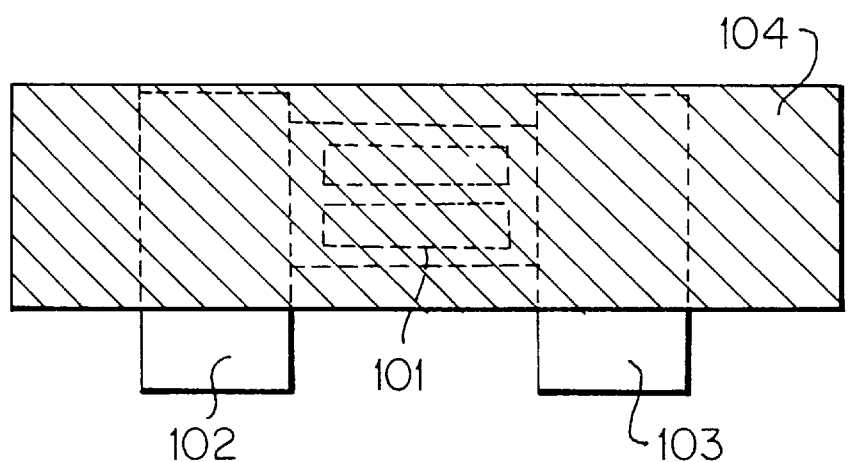

FIG. 16 shows a fourteenth embodiment of the present invention. The present embodiment has a structure in which three thin lines have their two ends connected with identical low-resistance regions (102) and (103) and controlled by a common control electrode (104) so that they constitutes one thin film region (101). The number of the thin lines may be two or more. If, in the case of one thin line, the line thickness if reduced, the conductance change due to the charge storage is increased, but the resistance rises at the same time to reduce the current. In the present embodiment, because of the plurality of lines, the flow rate of the current to flow between the low-resistance regions at the two ends is high with the line thickness being held small. Thanks to the use of the plurality of lines, their statistical characteristics can be utilized to feature the present embodiment in that it is strong against the characteristic dispersion of the individual lines. Moreover, the present structure is essential in that the separate portions are in the thin film regions, and this applies to the structure, in which the thin films are shunted midway, as shown in FIG. 20.

Figure 23A:
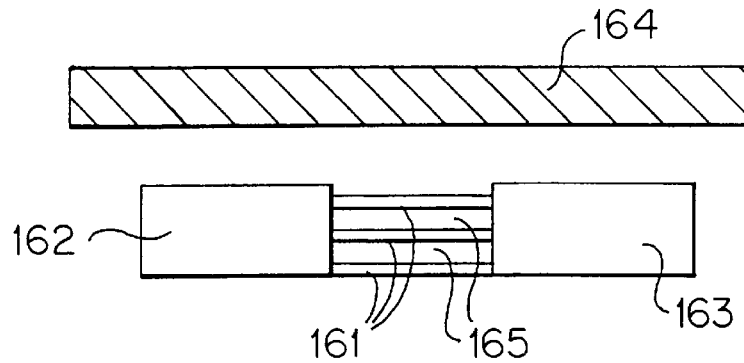
FIGS. 23(*a*) and 23(*b*) are structural diagrams of a semiconductor element of Embodiment 15 of the present invention: where 23(*a*) is a perspective view; and 23(*b*) is a top plan view.
Figure 23B:
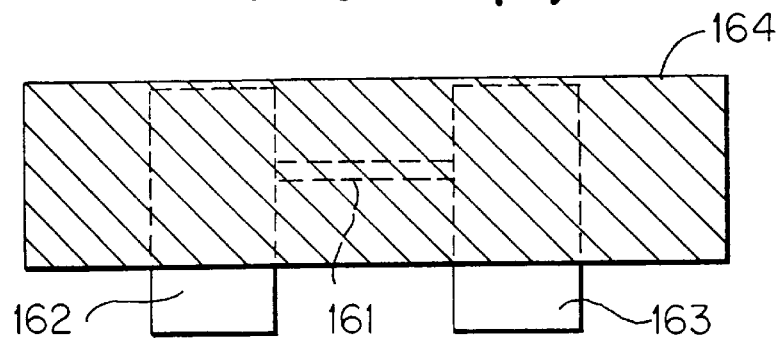

FIG. 23 shows a fifteenth embodiment of the present invention. The present embodiment is similar to the Embodiment 14 in the structure in which the three thin lines have their two ends connected with identical low-resistance regions (162) and (163) and controlled by a common control electrode (164) so that they constitute one thin film region (161), but is different in that the three thin lines take a stacked structure. Insulating films (165) are sandwiched between the thin lines. The present embodiment is similar to the Embodiment 14 in that the number of the thin lines may be two or more. The present embodiment is featured like the Embodiment 14, but another feature is that the thin film region (161) does not have its area enlarged even with the plurality of the thin lines by the stacked structure. The process of manufacturing the present structure is similar to the Embodiment 1 except that the thin film forming steps are repeated in the deposition of the thin films and in the formation of the insulating films and that the thin film portions of the three layers all work at once. On the other hand, there may be adopted together the stacked structure of the present embodiment and the structure, in which the thin lines of the Embodiment 14 are arranged in a common plane.

Figure 17A:
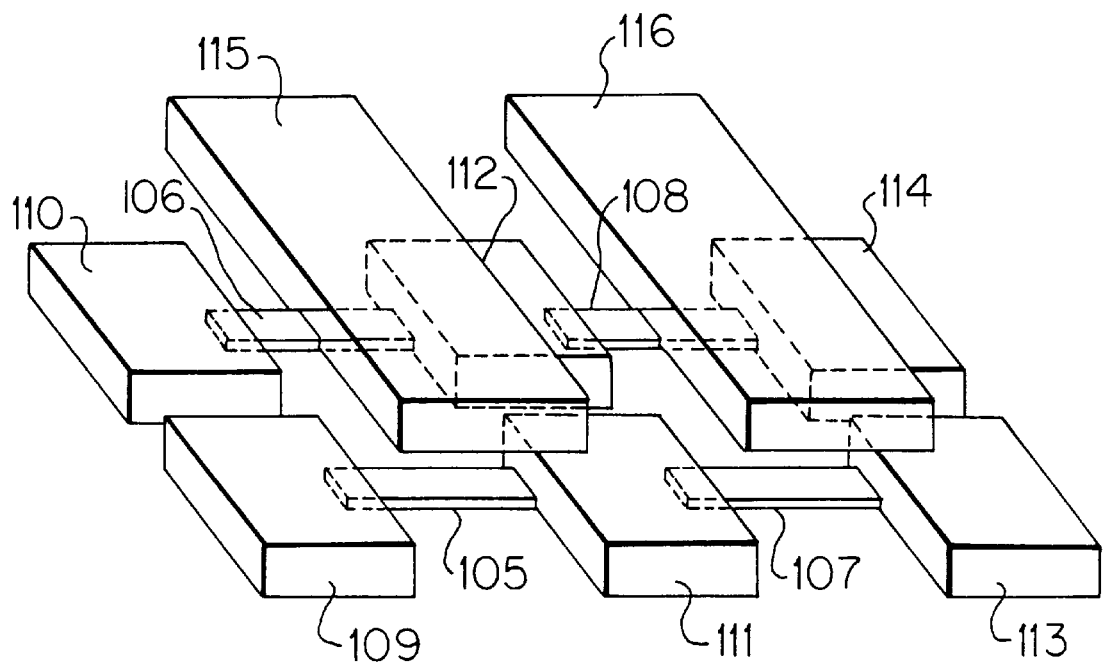
FIGS. 17(*a*) and 17(*b*) are structural diagrams of a semiconductor element of Embodiment 16 of the present invention: where 17(*a*) is a perspective view; and 17(*b*) is a top plan view.
Figure 17B:
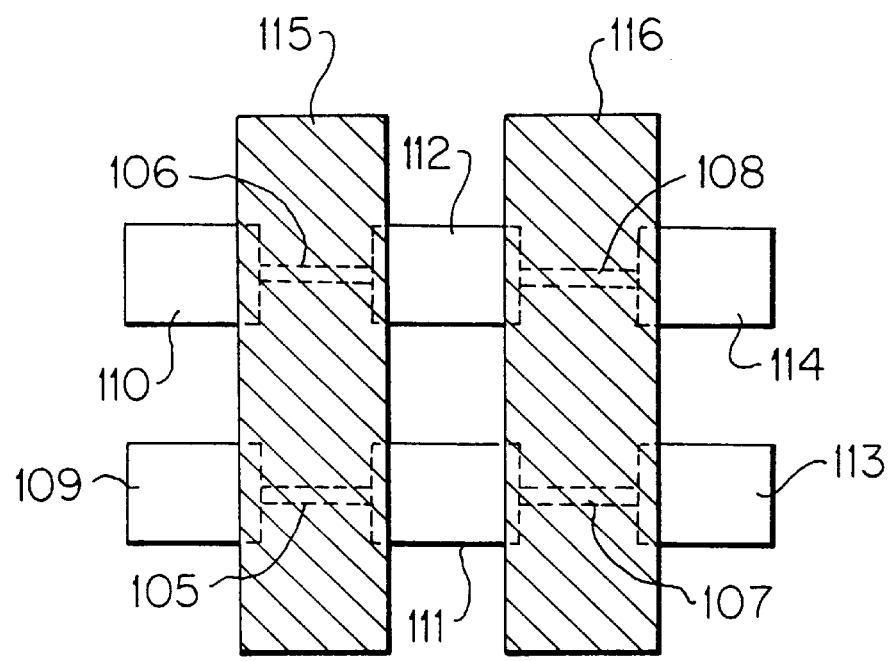

FIG. 17 shows a sixteenth embodiment of the present invention. The present memory element stores information of 4 bits or more. The memory element has four thin film regions 1 to 4 (105 to 108), six low-resistance regions 1 to 6 (109 to 114) and two control electrodes (115) and (116). The first thin film region (105) connects the first and second low-resistance regions (109) and (111); the third thin film region (106) connects the second and fourth low-resistance regions (110) and (112); the third thin film region (107) connects the third and fifth low-resistance regions (111) and (113); and the fourth thin film region (108) connects the fourth and sixth low-resistance regions (112) and (114). The first control electrode (115) is formed to cover the first thin film region (105) and the second thin film region (106), and the second control electrode (116) is formed to cover the third thin film region (107) and the fourth thin film region (108). The present structure is similar to those of the Embodiments 9 and 10 but need not to have its low-resistance region 3 (111) and low-resistance region 4 (112) formed with any contact because of the difference among the writing, erasing and reading operations, so that its area can be reduced. The present embodiment is different from the foregoing embodiments directed to the element for storing 4 bits or more, in that the current flows between the low-resistance region 1 (109) and the low-resistance region 5 (113) and between the low-resistance region 2 (110) and the low-resistance region 6 (114), and in that the thin film region 1 (105) and the thin film region 3 (107), and the thin film region 2 (106) and the thin film region 4 (108) are connected in series in the paths. In the writing operation of the thin film region 1 (105), the low-resistance region 1 (109) or the low-resistance region 5 (113) is set to a low potential (e.g., 0 V), and the low-resistance region 2 (110) or the low-resistance region 6 (114) is set to a higher potential (e.g., 5 V). The control electrode 1 (115) is set to a predetermined high potential Vw (e.g., 12 V), and the control electrode 2 (116) is set to a lower potential V1 (e.g., 5 V) than that of the control electrode 1 (115).

Here, the potential V1 is at such a high level as to conduct the thin film region 2 (106) no matter what information might be stored in the thin film region 2 (106). At this time, the thin film region 2 (106), the thin film region 3 (107) and the thin film region 4 (108) are not written. Incidentally, if the low-resistance region 2 (110) or the low-resistance region 6 (114) is set at this time to a potential (e.g., 0 V) as low as that of the low-resistance region 1 (109) or the low-resistance region 5 (113), the thin film region 1 (105) and the thin film region 2 (106) can be simultaneously written.

In the erasing operation, the stored information of the thin film region 1 (105) is erased by setting the low-resistance region 2 (110) or the low-resistance region 6 (114) to a predetermined low potential (e.g., both 0 V), the low-resistance region 1 (109) or the low-resistance region 5 (113) to a higher potential (e.g., 5 V), and the control electrode 1 (115) to a predetermined low potential Ve (e.g., −5 V). The control electrode 2 (116) is not set to a low potential (but to 5 V). At this time, the information of the thin film region 2 (106), the thin film region 3 (107) and the thin film region 4 (108) are not erased. Here, the applications of the high potential Vw and the low potential Ve are within a constant time period. When erasing, the block erasure of the thin film region 1 (105) and the thin film region 2 (106) can be achieved as in the writing operation by setting the potential of the low-resistance region 2 (110) and the low-resistance region 6 (114) to the same potential of the low-resistance region 1 (109) or the low-resistance region 5 (113). These information block writing and erasing operations thus controlled by the common control electrodes are especially effective at the time large storage is used by employing the present structure repeatedly, so that the writing and erasing time periods can be drastically shortened.

The reading of the information of the thin film region 1 (105) is carried out by reading out the conductance of the thin film region 1 (105) such that the value of the current to flow between the low-resistance region 1 (109) and the low-resistance region 5 (113) is metered by establishing a potential difference (e.g., 0 V or 1 V) between the low-resistance region 1 (109) and the low-resistance region 5 (113) to set the control electrode 1 (115) to a lower reading potential Vr (e.g., 3 V) than that of the control electrode 2 (116). Here, the potential V2 is set at such a high level as to conduct the thin film region 2 (106), no matter what information might be stored in the thin film region 2 (106), and at such a low level as to effect no writing operation.

Figure 18A:
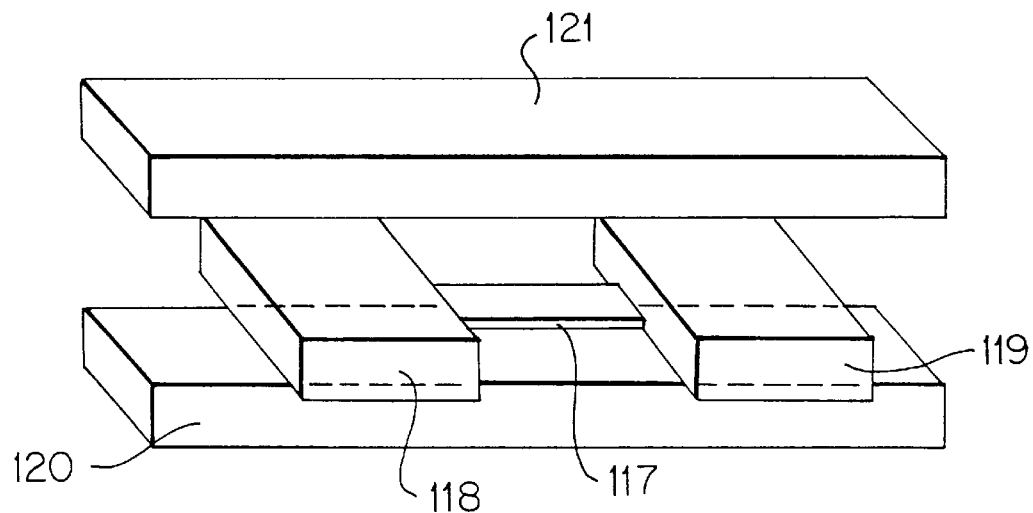
FIGS. 18(*a*) and 18(*b*) are structural diagrams of a semiconductor element of Embodiment 17 of the present invention: where 18(*a*) is a perspective view; and 18(*b*) is a top plan view.
Figure 18B:
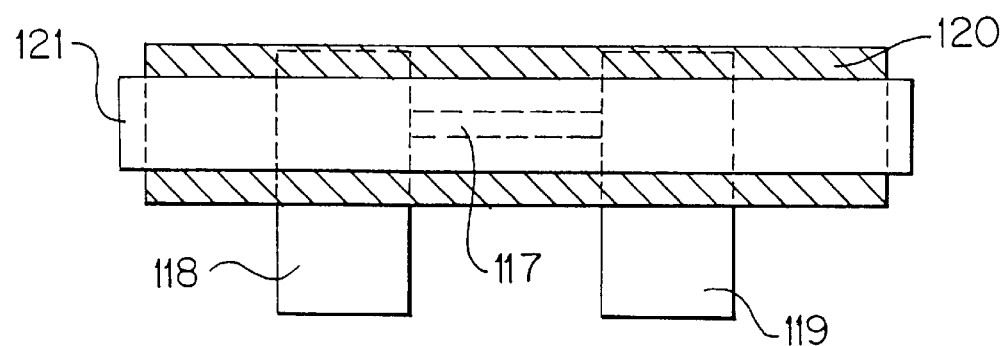

FIG. 18 shows a seventeenth embodiment of the present invention. This embodiment has a structure modified from the Embodiment 1 such that a control electrode (120) is formed below a thin film region (117) which is overlaid by a second control electrode (121). The capacity between the second control electrode (121) and the thin film region (117) is made lower than that between the first control electrode (120) and the thin film region (117). This may be effected by making the insulating film between the control electrode 2 (121) and the thin film region (117) thicker than the insulating film between the control electrode 1 (120) and the thin film region (117). At this time, the capacity between the thin film region (117) and the control electrode 2 (121) is further reduced by the control electrode 1 (120) disposed in the vicinity of the thin film region (117). This reduction can also be achieved by changing the material of the insulating film between the control electrode 1 (120) and the thin film region (117) and the material of the insulating film between the control electrode 2 (121) and the thin film region (117). The control electrode 1 (120) may be formed over the thin film region (117), and the control electrode 2 (121) may be formed below the thin film region (117). The control electrode 1 (120) is used in the writing and erasing operations of the memory element of the present embodiment, and the control electrode 2 (121) is used in the reading operation. As a result, the conductance change of the thin film region (117) by the charge storage can be increased while retaining the high speeds of the writing and erasing operations.

Figure 22:
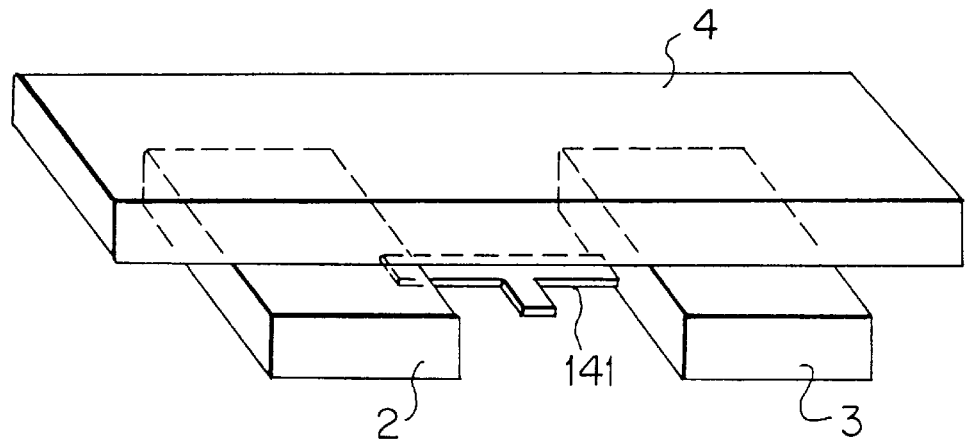
FIGS. 22(*a*) and 22(*b*) are structural diagrams of a semiconductor element of Embodiment 18 of the present invention: where 22(*a*) is a perspective view; and 22(*b*) is a top plan view.
Figure 22:
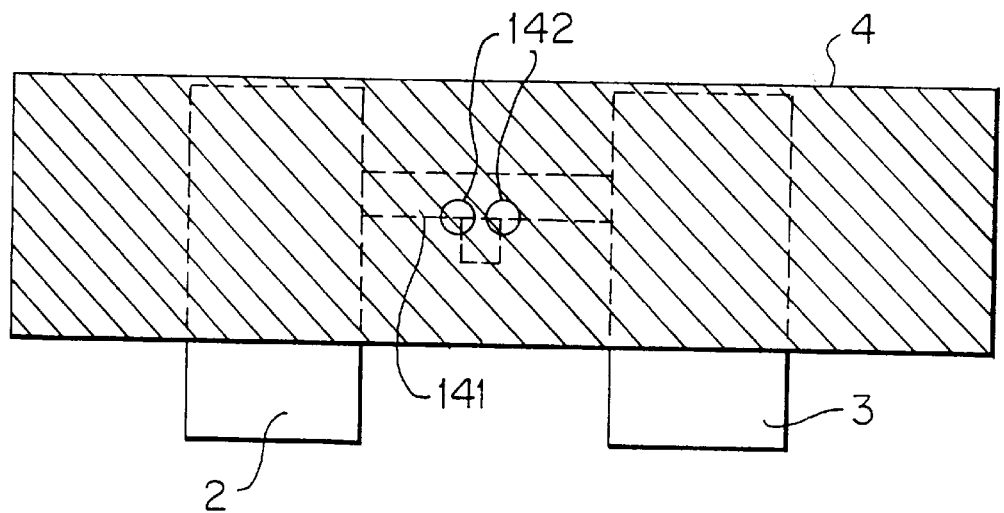

FIG. 22 shows an eighteenth embodiment of the present invention. The present embodiment is different from the Embodiment 1 in that it takes a structure in which a thin film region (141) has a projection in the course from the low-resistance region 1 (2) to the low-resistance region 2 (3). In the present structure, the charge capture region is made small by making use of the fact that the charges will be captured by the projection, so that the dispersions of the stored charge between the elements and the conductance change between the elements in the case of equal quantities of the stored charge is reduced to stabilize the characteristics of the memory. Without the projection, the thin film will cause, if shaped in a rectangle having no projection, the charge capture anywhere on its whole surface. The charge is liable to be captured in the projection because of the area, and the electric field is liable to be concentrated at the root (142) of the projection. As a result, the present embodiment is featured in that the charge is liable to be captured by the projection.

Figure 27A:
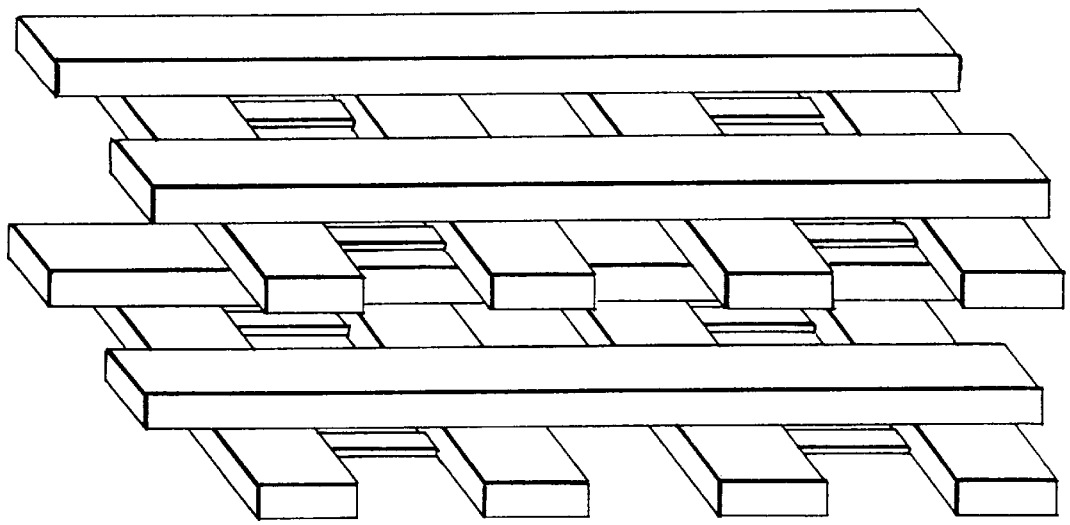
FIGS. 27(*a*) and 27(*b*) are structural diagrams of a semiconductor element of Embodiment 19 of the present invention: where 27(*a*) is a perspective view; and 27(*b*) is a top plan view.
Figure 27B:
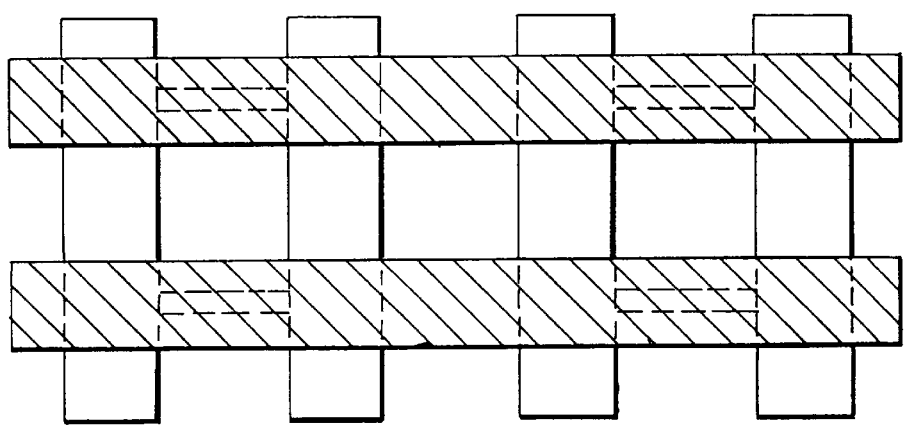

FIG. 27 shows a nineteenth embodiment of the present invention. In the present embodiment, the two structures of the Embodiment 11 are stacked vertically in two layers across an insulating film so as to store 8 bits or more. This two-layer structure is featured in that the memory can be doubled without any increase in the area, so that the memory density can be further increased if the structures are stacked in more layers. This means that no contact may be disposed in the vicinity of the cell unlike the Embodiment 11 (as shown in FIG. 14). The individual layers can be written and read as in the Embodiment 11.

Figure 28A:
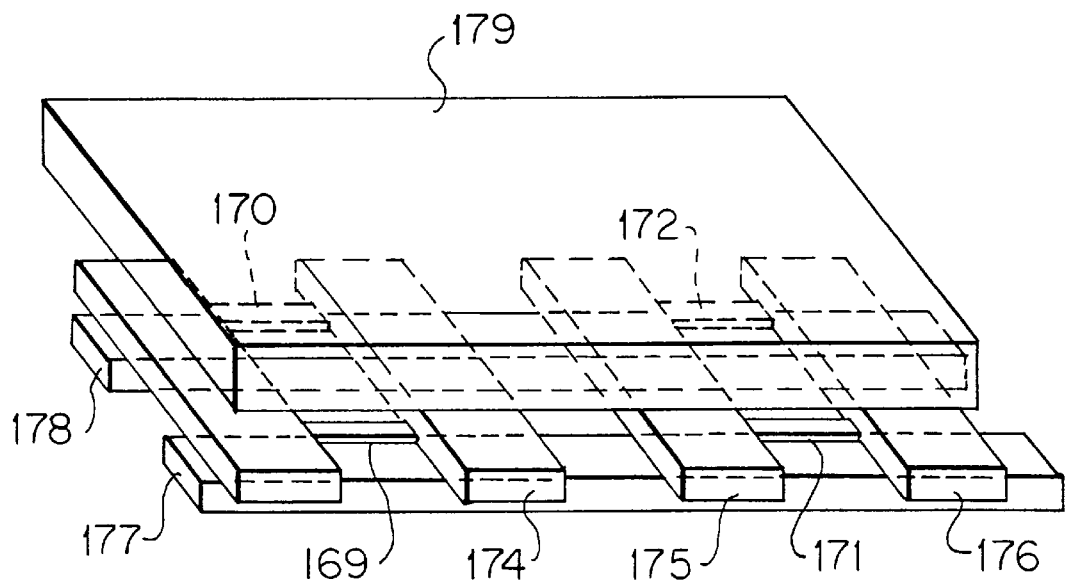
FIGS. 28(*a*) and 28(*b*) are structural diagrams of a semiconductor element of Embodiment 20 of the present invention: where 28(*a*) is a perspective view; and 28(*b*) is a top plan view.
Figure 28B:
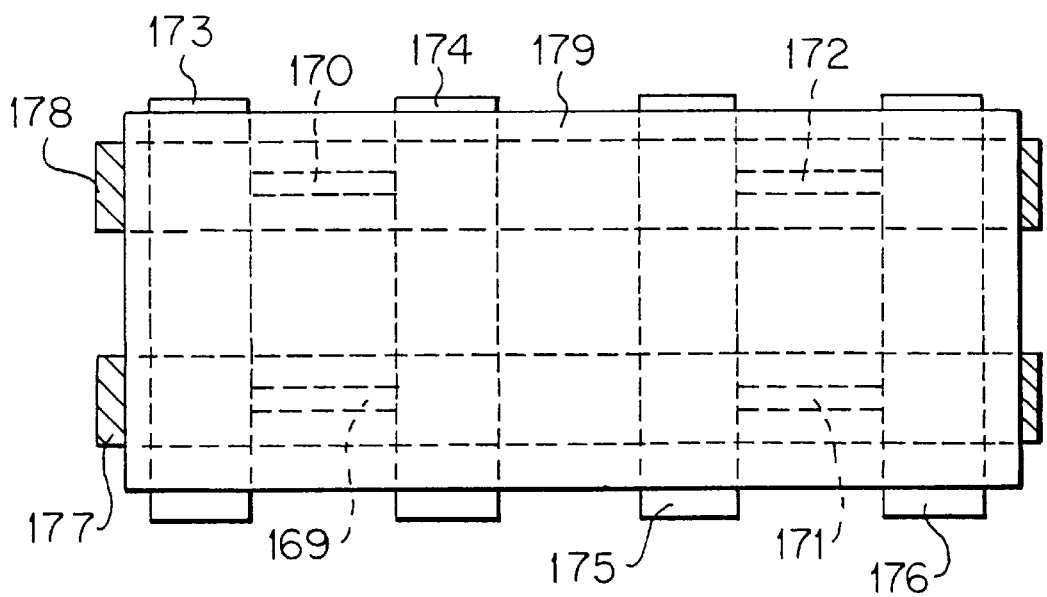

FIG. 28 shows a twentieth embodiment of the present invention. The present embodiment is modified from the structure of the Embodiment 11 such that a control electrode 1 (177) and a control electrode 2 (178) are laid below thin film regions 1 to 4 (169) to (172) which are overlaid by a common control electrode 3 (179) shared among the thin film regions 1 to 4 (169) to (172). The control electrode 1 (177) and the control electrode 2 (178) may be formed over the thin film regions 1 to 4 (169) to (172), which may be underlaid by the control electrode 3 (179). The present structure is featured in that the information of the thin film regions 1 to 4 (169) to (172) can be erased or written in a block by using the control electrode 3 (179). Even in case more cells are arranged, by providing a control electrode covering the cells of a desired range in addition to the control electrode to be written by 1 bit, the cells in that range can be erased or written in a block so that the functions as the memory chip can be increased.

According to the present invention, it is possible to provide a semiconductor memory element which can share the terminals easily among a plurality of memory elements and can pass a high current and which is strong against the noises.

While the present invention has been described above with reference to the preferred embodiments disclosed, one of ordinary skill in the art would be enabled by this disclosure to make various modifications to the present invention and still be within the scope and spirit of the present invention as defined by the appended claims.

What is claimed is:

1. A method of forming a memory element for use in a large-scale integrated circuit comprising the steps of:

forming, on a silicon substrate, an insulating layer;

depositing a silicon nitride film over the insulating layer;

depositing a highly-doped n-type polycrystalline silicon layer over the silicon nitride film to form at least two low-resistance regions;

depositing a layer of amorphous silicon to form a thin film region over the low-resistance regions and a portion of the silicon nitride film;

depositing a layer of silicon dioxide over the thin film and the silicon nitride film; and depositing a layer of highly-doped n-type polycrystalline silicon over the layer of silicon dioxide in order to form a control electrode of the memory element.

2. The method according to claim 1, wherein the control electrode is formed so as to completely cover the thin film region.

3. The method according to claim 1, wherein the memory element is capable of storing at least two bits.

* * * * *